United States Patent
Kato et al.

(10) Patent No.: US 10,453,513 B2
(45) Date of Patent: *Oct. 22, 2019

(54) MAGNETIC MEMORY DEVICE

(71) Applicant: Kabushiki Kaisha Toshiba, Minato-ku (JP)

(72) Inventors: Yushi Kato, Chofu (JP); Yoshiaki Saito, Kawasaki (JP); Mizue Ishikawa, Yokohama (JP); Soichi Oikawa, Hachioji (JP); Hiroaki Yoda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/918,000

(22) Filed: Mar. 12, 2018

(65) Prior Publication Data

US 2019/0080741 A1    Mar. 14, 2019

(30) Foreign Application Priority Data

Sep. 14, 2017  (JP) .................................. 2017-176435

(51) Int. Cl.
  *G11C 11/16*  (2006.01)
  *H01L 27/22*  (2006.01)
  (Continued)

(52) U.S. Cl.
  CPC ........ *G11C 11/1675* (2013.01); *G11C 11/161* (2013.01); *G11C 11/1673* (2013.01);
  (Continued)

(58) Field of Classification Search
  CPC .............. G11C 11/1675; G11C 11/161; G11C 11/1673; G11C 11/18; H01F 10/3254;
  (Continued)

(56) References Cited

U.S. PATENT DOCUMENTS 8,686,521 B2    4/2014  Daibou et al.
2016/0380186 A1  12/2016  Daibou et al.
(Continued)

FOREIGN PATENT DOCUMENTS

JP    2010-238769    10/2010
JP       4745414     8/2011
(Continued)

OTHER PUBLICATIONS https://en.wikipedia.org/wiki/Lanthanide, Sep. 5, 2017, all pages (Year: 2017).*
(Continued)

*Primary Examiner* — Fernando Hidalgo
(74) *Attorney, Agent, or Firm* — Oblon, McClelland, Maier & Neustadt, L.L.P.

(57) ABSTRACT

According to one embodiment, a magnetic memory device includes a conductive layer, a first magnetic layer, a second magnetic layer, a first nonmagnetic layer, and a controller. The conductive layer includes first and second portions, and a third portion between the first and second portions. The conductive layer includes a first metal and boron. The first magnetic layer is separated from the third portion in a first direction crossing a second direction. The second magnetic layer is provided between the third portion and the first magnetic layer. The first nonmagnetic layer is provided between the first and second magnetic layers. The controller is electrically connected to the first and second portions. The controller supplies a current to the conductive layer. The first metal includes at least one selected from the group consisting of La, Ce, Pr, Nd, Sm, Eu, Gd, Tb, Dy, Ho, Er, Tm, Yb, and Lu.

20 Claims, 11 Drawing Sheets

(51) Int. Cl.
*H01L 43/06* (2006.01)
*H01L 43/08* (2006.01)
*H01L 43/10* (2006.01)
*H01F 10/32* (2006.01)
*G11C 11/18* (2006.01)

(52) U.S. Cl.
CPC ..... *H01F 10/3254* (2013.01); *H01F 10/3272* (2013.01); *H01F 10/3286* (2013.01); *H01L 27/228* (2013.01); *H01L 43/06* (2013.01); *H01L 43/08* (2013.01); *H01L 43/10* (2013.01); *G11C 11/18* (2013.01)

(58) Field of Classification Search
CPC . H01F 10/3286; H01F 10/3272; H01L 43/10; H01L 43/08; H01L 43/06; H01L 27/228
USPC .......................................................... 365/158
See application file for complete search history.

(56) References Cited

U.S. PATENT DOCUMENTS

| | | | |
|---|---|---|---|
| 2017/0040095 A1* | 2/2017 | Levin | ............ H01F 6/006 |
| 2017/0076769 A1 | 3/2017 | Shirotori et al. | |
| 2017/0076770 A1 | 3/2017 | Daibou et al. | |
| 2017/0169872 A1 | 6/2017 | Yoda et al. | |
| 2017/0222135 A1 | 8/2017 | Fukami et al. | |
| 2018/0174634 A1 | 6/2018 | Kato et al. | |

FOREIGN PATENT DOCUMENTS

| | | |
|---|---|---|
| JP | 2015-176930 | 10/2015 |
| JP | 2017-59594 | 3/2017 |
| JP | 2017-59634 A | 3/2017 |
| JP | WO 2016/021468 A1 | 5/2017 |
| JP | 2018-98432 A | 6/2018 |
| JP | WO 2017/090730 A1 | 9/2018 |
| JP | WO 2017/090739 A1 | 9/2018 |

OTHER PUBLICATIONS

Nanomagnetism and Spintronics: Fabrication, Materials, Characterization and Applications; World Scientific to Nasirpouri et al.; 2011. (Year: 2011).* https://en.wikipedia.org/wiki/Lanthanide, all pages (Year: 2017).*

Faruque M. Hossain et al. "Ab Initio Calculations of the Electronic Structure and Bonding Characteristics of $LaB_6$", Physical review B, vol. 72, 2005, pp. 235101-1 to 235101-5.

B. I. Min et al. "Band Folding and Fermi Surface in Antiferromagnetic $NdB_6$" Physical review B, vol. 44, No. 24, Dec. 15, 1991, pp. 13 270 to 13 276.

* cited by examiner

MAGNETIC MEMORY DEVICE

CROSS-REFERENCE TO RELATED APPLICATIONS

This application is based upon and claims the benefit of priority from Japanese Patent Application No. 2017-176435, filed on Sep. 14, 2017; the entire contents of which are incorporated herein by reference.

FIELD

Embodiments described herein relate generally to a magnetic memory device.

BACKGROUND

There is a magnetic memory device that uses a magnetic layer. Stable operations of the magnetic memory device are desirable.

DETAILED DESCRIPTION

Figure 1A:
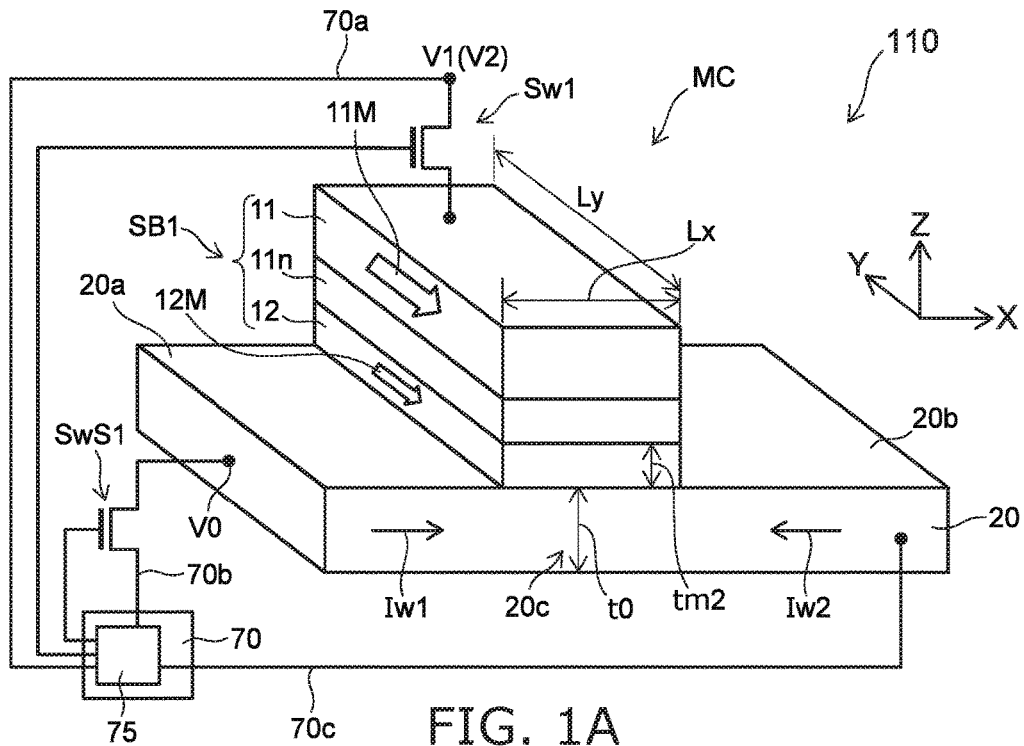
FIG. 1A and FIG. 1B are schematic perspective views illustrating a magnetic memory device according to a first embodiment.

According to one embodiment, a magnetic memory device includes a conductive layer, a first magnetic layer, a second magnetic layer, a first nonmagnetic layer, and a controller. The conductive layer includes a first portion, a second portion, and a third portion between the first portion and the second portion. The conductive layer includes a first metal and boron. The first magnetic layer is separated from the third portion in a first direction crossing a second direction. The second direction is from the first portion toward the second portion. The second magnetic layer is provided between the third portion and the first magnetic layer. The first nonmagnetic layer is provided between the first magnetic layer and the second magnetic layer. The controller is electrically connected to the first portion and the second portion. The controller is configured to supply a current to the conductive layer. The first metal includes at least one selected from the group consisting of La, Ce, Pr, Nd, Sm, Eu, Gd, Tb, Dy, Ho, Er, Tm, Yb, and Lu.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
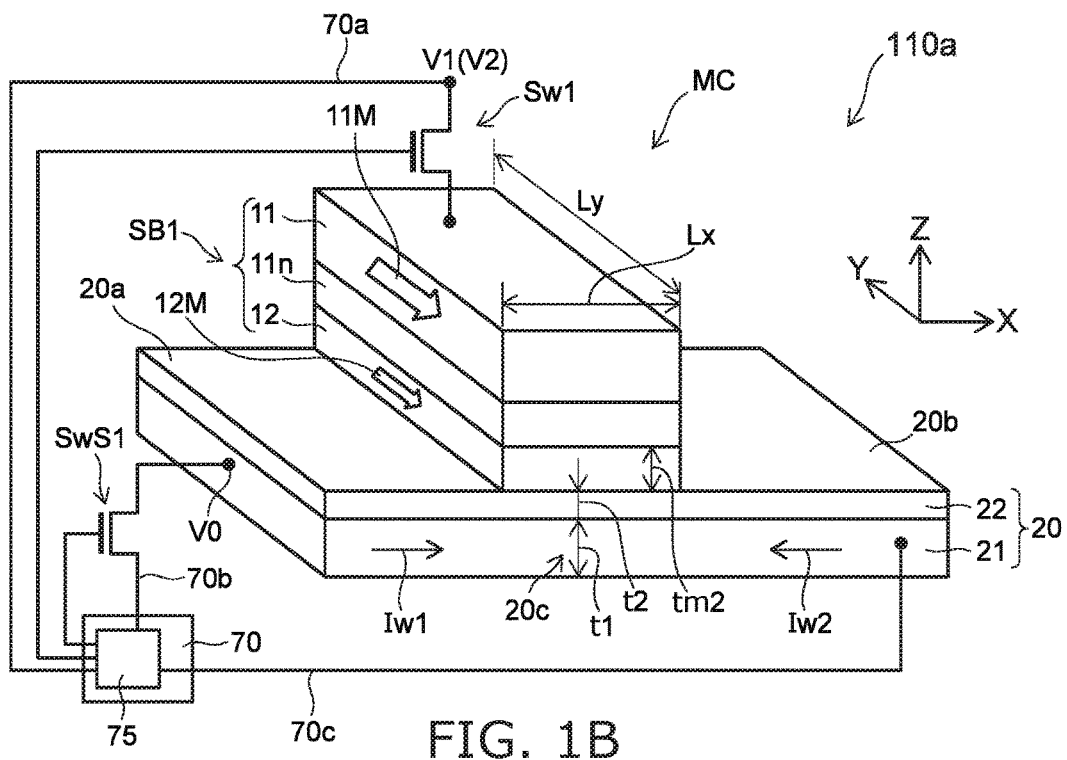

FIG. 1A and FIG. 1B are schematic perspective views illustrating a magnetic memory device according to a first embodiment.

As shown in FIG. 1A, the magnetic memory device 110 according to the embodiment includes a conductive layer 20, a first magnetic layer 11, a second magnetic layer 12, a first nonmagnetic layer 11n, and a controller 70.

The conductive layer 20 includes a first portion 20a, a second portion 20b, and a third portion 20c. The third portion 20c is positioned between the first portion 20a and the second portion 20b.

The conductive layer 20 includes a first metal and boron. The first metal includes at least one selected from the group consisting of La, Ce, Pr, Nd, Sm, Eu, Gd, Tb, Dy, Ho, Er, Tm, Yb, and Lu. The conductive layer 20 may be, for example, nonmagnetic.

The first magnetic layer 11 is separated from the third portion 20c in a first direction. The first direction crosses a direction (a second direction) from the first portion 20a toward the second portion 20b.

The first direction is taken as a Z-axis direction. One direction perpendicular to the Z-axis direction is taken as an X-axis direction. A direction perpendicular to the Z-axis direction and the X-axis direction is taken as a Y-axis direction. In the example, the second direction is the X-axis direction.

The second magnetic layer 12 is provided between the third portion 20c and the first magnetic layer 11. The second magnetic layer 12 is electrically connected to the third portion 20c. The first nonmagnetic layer 11n is provided between the first magnetic layer 11 and the second magnetic layer 12. Another layer may be provided between the first nonmagnetic layer 11n and the first magnetic layer 11. Another layer may be provided between the first nonmagnetic layer 11n and the second magnetic layer 12.

The first magnetic layer 11 functions as, for example, a reference layer. The second magnetic layer 12 functions as, for example, a memory layer (e.g., a free layer). A second magnetization 12M of the second magnetic layer 12 changes more easily than a first magnetization 11M of the first magnetic layer 11. The orientation of the second magnetization 12M of the second magnetic layer 12 corresponds to information that is stored. For example, the orientation of the magnetization corresponds to the orientation of the easy magnetization axis.

The first magnetic layer 11, the first nonmagnetic layer 11n, and the second magnetic layer 12 are included in a first stacked body SB1. The first stacked body SB1 functions as, for example, at least a portion of one memory cell MC. The first stacked body SB1 has, for example, a magnetic tunnel junction (MTJ). The first stacked body SB1 corresponds to a MTJ element.

In the example, the easy magnetization axis of the second magnetic layer 12 crosses the first direction (e.g., the Z-axis direction). The second magnetic layer 12 is an in-plane magnetization film.

In the example, a length Ly along a third direction of the first magnetic layer 11 is longer than a length Lx along the second direction of the first magnetic layer 11. The third direction crosses a plane including the first direction and the second direction. The third direction is, for example, the Y-axis direction. Shape anisotropy occurs in the first magnetic layer 11 and the second magnetic layer 12. For example, the first magnetization 11M of the first magnetic layer 11 is aligned with the Y-axis direction. For example, the second magnetization 12M of the second magnetic layer 12 is oriented in the +Y direction or the −Y direction. In other examples of the embodiment as described below, the relationship between the length Ly and the length Lx is arbitrary. In the embodiment, the orientation of the magnetization is arbitrary.

In the example, the first magnetic layer 11 is, for example, an in-plane magnetization film. For example, the first magnetization 11M of the first magnetic layer 11 crosses the first direction (the Z-axis direction). In the example, the first magnetization 11M of the first magnetic layer 11 is aligned with the third direction (e.g., the Y-axis direction, i.e., a direction crossing a plane including the first direction and the second direction). For example, the orientation of the first magnetization 11M in the X-Y plane is arbitrary.

The controller 70 is electrically connected to the first portion 20a and the second portion 20b. The controller 70 supplies a current to the conductive layer 20. In the example, the controller 70 includes a control circuit 75. The control circuit 75 (the controller 70) and the first portion 20a are electrically connected by an interconnect 70b. The control circuit 75 (the controller 70) and the second portion 20b are electrically connected by an interconnect 70c. In the example, a switch SwS1 is provided in a current path (the interconnect 70b) between the control circuit 75 and the first portion 20a. The gate (the control terminal) of the switch SwS1 is electrically connected to the control circuit 75.

In the example, the control circuit 75 (the controller 70) is electrically connected to the first magnetic layer 11. The control circuit 75 (the controller 70) and the first magnetic layer 11 are electrically connected by an interconnect 70a. In the example, a switch Sw1 is provided in a current path (the interconnect 70a) between the control circuit 75 and the first magnetic layer 11. The gate (the control terminal) of the switch Sw1 is electrically connected to the control circuit 75.

These switches may be included in the controller 70. The potentials of the conductive layer 20 and the first stacked body SB1 are controlled by the controller 70.

For example, the first portion 20a is set to a reference potential V0; and a first voltage V1 (e.g., a select voltage) is applied to the first magnetic layer 11. At this time, for example, the electrical resistance of the first stacked body SB1 changes according to the orientation of the current flowing in the conductive layer 20. On the other hand, the first portion 20a is set to the reference potential V0; and a second voltage V2 (e.g., an unselect voltage) is applied to the first magnetic layer 11. The second voltage V2 is different from the first voltage V1. When the second voltage V2 is applied, for example, the electrical resistance of the first stacked body SB1 substantially does not change even in the case where a current flows in the conductive layer 20. The change of the electrical resistance corresponds to the change of the state of the first stacked body SB1. For example, the change of the electrical resistance corresponds to the change of the orientation of the second magnetization 12M of the second magnetic layer 12. For example, the second voltage V2 is different from the first voltage V1. For example, the absolute value of the potential difference between the reference potential V0 and the first voltage V1 is greater than the absolute value of the potential difference between the reference potential V0 and the second voltage V2. For example, the polarity of the first voltage V1 may be different from the polarity of the second voltage V2. Such an electrical resistance difference is obtained by a control of the controller 70.

For example, the controller 70 performs a first operation and a second operation. These operations are operations when the select voltage is applied to the stacked body SB1. In the first operation, the controller 70 supplies a first current Iw1 to the conductive layer 20 from the first portion 20a toward the second portion 20b (referring to FIG. 1A). In the second operation, the controller 70 supplies a second current Iw2 to the conductive layer 20 from the second portion 20b toward the first portion 20a (referring to FIG. 1A).

The first electrical resistance between the first magnetic layer 11 and the first portion 20a after the first operation is different from the second electrical resistance between the first magnetic layer 11 and the first portion 20a after the second operation. For example, such an electrical resistance difference corresponds to the change of the orientation of the second magnetization 12M of the second magnetic layer 12. For example, the orientation of the second magnetization 12M changes due to the current (a write current) flowing through the conductive layer 20. For example, it is considered that this is based on the spin Hall effect. For example, it is considered that the change of the orientation of the second magnetization 12M is based on spin-orbit coupling.

For example, due to the first operation, the second magnetization 12M has a component having the same orientation as the orientation of the first magnetization 11M. A "parallel" magnetization is obtained. On the other hand, due to the second operation, the second magnetization 12M has a component having the reverse orientation of the orientation of the first magnetization 11M. An "antiparallel" magnetization is obtained. In such a case, the first electrical resistance after the first operation is lower than the second electrical resistance after the second operation. Such an electrical resistance difference corresponds to the information to be stored. For example, the different multiple magnetizations correspond to the information to be stored.

The controller 70 may further implement a third operation and a fourth operation. In the third operation, the potential difference between the first portion 20a and the first magnetic layer 11 is set to the second voltage V2; and the first current Iw1 is supplied to the conductive layer 20. In the fourth operation, the potential difference between the first portion 20a and the first magnetic layer 11 is set to the second voltage V2; and the second current Iw2 is supplied to the conductive layer 20. For example, in the third operation and the fourth operation, the electrical resistance of the first stacked body SB1 substantially does not change even in the case where a current flows in the conductive layer 20. The first electrical resistance between the first magnetic layer 11 and the first portion 20a after the first operation is different from the second electrical resistance between the first magnetic layer 11 and the first portion 20a after the second operation. The absolute value of the difference between the first electrical resistance and the second electrical resistance is greater than the absolute value of the difference between a third electrical resistance between the first magnetic layer 11 and the first portion 20a after the third operation and a fourth electrical resistance between the first magnetic layer 11 and the first portion 20a after the fourth operation.

The second magnetic layer 12 includes at least one selected from the group consisting of Co and Fe. For example, the second magnetic layer 12 includes, for example, $Co_{x1}Fe_{1-x1}$ ($0 \le x1 \le 0.6$). The second magnetic layer 12 may further include boron (B).

In the embodiment, a thickness t0 (the length along the first direction (the Z-axis direction)) of the conductive layer 20 is, for example, not less than 2 nanometers (nm) and not more than 11 nm. On the other hand, a thickness tm2 (the length along the first direction (the Z-axis direction)) of the second magnetic layer 12 is not less than 0.5 nanometers and not more than 3 nanometers. Lattice mismatch occurs effectively when these layers are in the appropriate range. The lattice relaxes easily when the thickness is excessively thick.

As described above, the conductive layer 20 includes boron and the first metal (e.g., at least one selected from the group consisting of La, Ce, Pr, Nd, Sm, Eu, Gd, Tb, Dy, Ho, Er, Tm, Yb, and Lu). In one example, the concentration of boron in the conductive layer 20 is substantially uniform. In another example, the concentration of boron may change in the conductive layer 20. One example in which the concentration of boron changes in the thickness direction will now be described.

In a magnetic memory device 110a as shown in FIG. 1B, the conductive layer 20 includes a first region 21 and a second region 22. The second region 22 is provided between the first region 21 and the second magnetic layer 12. For example, the second region 22 physically contacts the second magnetic layer 12.

The second region 22 includes the first metal and boron. On the other hand, the first region 21 may include the first metal and may not include boron. Or, the first region 21 may include the first metal and boron; and a first concentration of boron in the first region 21 may be lower than a second concentration of boron in the second region 22. For example, the first region 21 may not include the first metal.

As described below, such a second region 22 may be provided in a portion (the third portion 20c) of the conductive layer 20. For example, the second region 22 may be provided locally in a portion (the third portion 20c) including a region overlapping the first stacked body SB1 in the Z-axis direction. For example, the third portion 20c includes the first region 21 and the second region 22. The first portion 20a and the second portion 20b may include the first region 21 and may not include the second region 22.

In the example, the first region 21 extends along the second direction (e.g., the X-axis direction) between the first portion 20a and the second portion 20b. The second region 22 extends along the second direction between the first portion 20a and the second portion 20b.

As described below, a large spin Hall effect is obtained by providing such a first region 21 and such a second region 22 in the conductive layer 20.

In the embodiment, a first thickness t1 along the first direction of the first region 21 is, for example, not less than 1 nanometer and not more than 10 nanometers. A second thickness t2 along the first direction of the second region 22 is, for example, not less than 1 nanometer and not more than 10 nanometers. The sum of the first thickness t1 and the second thickness t2 corresponds to the thickness t0 (referring to FIG. 1A).

Figure 2:
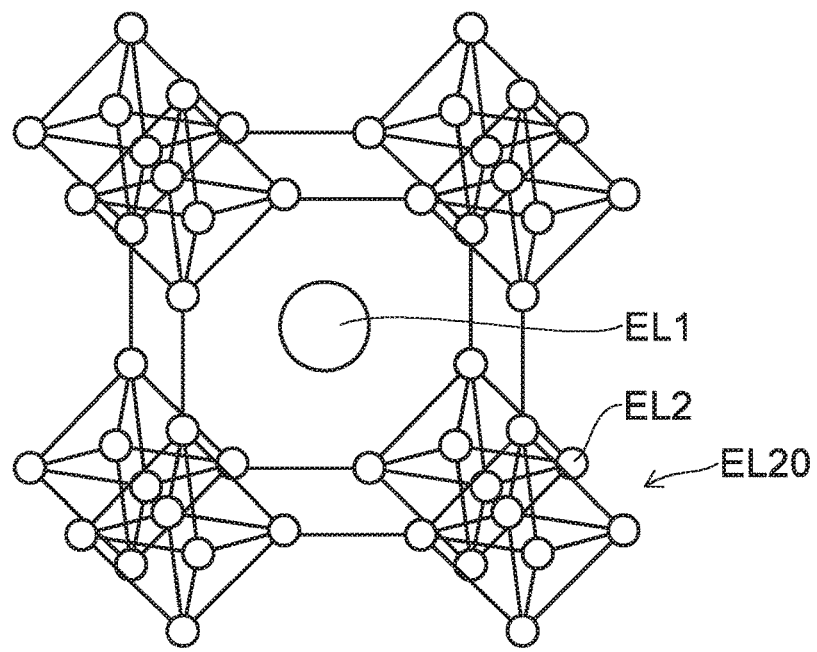
FIG. 2 is a schematic view illustrating a material of the magnetic memory device according to the first embodiment.

FIG. 2 is a schematic view illustrating a material of the magnetic memory device according to the first embodiment. FIG. 2 shows an example of the material included in the conductive layer 20. The conductive layer 20 includes a first metal EL1 and boron EL2. In the case where the first metal EL1 is Ce, the conductive layer 20 includes $CeB_6$. For example, in the case where the first metal EL1 is Pr, the conductive layer 20 includes $PrB_6$. For example, in the case where the first metal EL1 is Nd, the conductive layer 20 includes Nd $B_6$. In the case where the first metal EL1 is La, the conductive layer 20 includes $LaB_6$. In such cases, the material that includes the first metal EL1 and the boron EL2 is a hexaboride. Thus, at least a portion of the conductive layer 20 may include a hexaboride.

For example, six borons EL2 form an octahedron. A boron framework is formed of eight octahedrons. One first metal EL1 is positioned inside the boron framework. For example, the material that includes the first metal EL1 and the boron EL2 has a CsCl crystal structure.

The first metal EL1 may include at least one selected from the group consisting of Sm, Eu, Gd, Tb, Dy, Ho, Er, Tm, Yb, and Lu. Even in such a case, the material that includes the first metal EL1 and the boron EL2 is a hexaboride. For example, the material that includes the first metal EL1 and the boron EL2 has a CsCl crystal structure.

In the case where the first metal EL1 is Ce, etc., the first metal EL1 includes, for example, an electron of the 4f orbital or the 5d orbital. For example, a large spin Hall effect occurs between the conductive layer 20 and the second magnetic layer 12 due to the contribution of the interaction between the electron of the 2p orbital of the boron EL2 and the electron of the 4f orbital or the 5d orbital of the first metal EL1. Therefore, a large spin Hall angle θ (absolute value) is obtained.

In the case where the first metal EL1 is Nd, etc., the first metal EL1 includes, for example, an electron of the 4f orbital. For example, a large spin Hall effect occurs between the conductive layer 20 and the second magnetic layer 12 due to the contribution of the interaction between the electron of the 4f orbital of the first metal EL1 and the electron of the 2p orbital of the boron EL2. Therefore, a large spin Hall angle θ (the absolute value) is obtained.

Conventionally, an approach is known of using a d-orbital electron such as the electron of the 4d orbital, the 5d orbital, etc., as the metal of the conductive layer 20. In the embodiment, the electron of the 4f orbital or the electron of the 5d orbital is used. Thereby, a large spin Hall effect is obtained.

Thereby, the second magnetization 12M of the second magnetic layer 12 can be controlled stably by the write current (the first current Iw1 and the second current Iw2) supplied to the conductive layer 20. For example, the write operation is stable. A magnetic memory device can be provided in which stable operations are possible.

In one example, the first metal EL1 includes La, Ce, etc. For example, the first metal EL1 includes a rare-earth element. In such a case, the first metal EL1 is trivalent ($3^+$). In such a case, the material that includes the first metal EL1 and the boron EL2 has characteristics close to those of a conductor.

For example, the conductive layer 20 includes at least one selected from the group consisting of $CeB_6$, $PrB_6$, and $NdB_6$ in the case where the first metal EL1 includes at least one selected from the group consisting of Ce, Pr, and Nd. The resistivity is low for these materials. For example, a low resistance is obtained in the conductive layer 20. In the case where the first metal EL1 includes La, the conductive layer 20 includes $LaB_6$. The resistivity is low for $LaB_6$. For example, a low resistance is obtained in the conductive layer 20.

For example, the first metal EL1 includes at least one selected from the group consisting of La, Ce, Pr, Nd, Sm, Eu, Gd, Tb, Dy, Ho, Er, Tm, Yb, and Lu. For example, a large spin Hall effect is obtained in the conductive layer 20 in the case where the first metal EL1 includes two selected from the group consisting of La, Ce, Pr, Nd, Sm, Eu, Gd, Tb, Dy, Ho, Er, Tm, Yb, and Lu. A low resistance is obtained. For example, the conductive layer 20 includes at least one selected from the group consisting of $(La, Ce)B_6$, $(La, Pr)B_6$, $(La, Nd)B_6$, $(Ce, Pr)B_6$, $(Ce, Nd)B_6$, $(Pr, Nd)B_6$, $(La, Sm)B_6$, $(La, Eu)B_6$, $(La, Gd)B_6$, $(La, Tb)B_6$, $(La, Dy)B_6$, $(La, Ho)B_6$, $(La, Er)B_6$, $(La, Tm)B_6$, $(La, Yb)B_6$, $(La, Lu)B_6$, $(Ce, Sm)B_6$, $(Ce, Eu)B_6$, $(Ce, Gd)B_6$, $(Ce, Tb)B_6$, $(Ce, Dy)B_6$, $(Ce, Ho)B_6$, $(Ce, Er)B_6$, $(Ce, Tm)B_6$, $(Ce, Yb)B_6$, $(Ce, Lu)B_6$, $(Pr, Sm)B_6$, $(Pr, Eu)B_6$, $(Pr, Gd)B_6$, $(Pr, Tb)B_6$, $(Pr, D_y)B_6$, $(Pr, Ho)B_6$, $(Pr, Er)B_6$, $(Pr, Tm)B_6$, $(Pr, Yb)B_6$, $(Pr, Lu)B_6$, $(Nd, Sm)B_6$, $(Nd, Eu)B_6$, $(Nd, Gd)B_6$, $(Nd, Tb)B_6$, $(Nd, Dy)B_6$, $(Nd, Ho)B_6$, $(Nd, Er)B_6$, $(Nd, Tm)B_6$, $(Nd, Yb)B_6$, and $(Nd, Lu)B_6$. For example, the write operation is stable. A magnetic memory device can be provided in which stable operations are possible.

For example, the current consumption of the write operation can be suppressed. For example, the heat generation, etc., can be suppressed; and the operations are stable.

In one example as recited above, the first metal EL1 is, for example, a rare-earth element.

The lattice constant of the material including such an element (the first metal EL1) and the boron EL2 is different from the lattice constant of the material (e.g., CoFe, CoFeB, etc.) included in the second magnetic layer 12. The lattice length of the second magnetic layer 12 changes from the lattice constant due to the lattice constant difference. Thereby, for example, anisotropy occurs in the second magnetic layer 12.

Figure 3A:
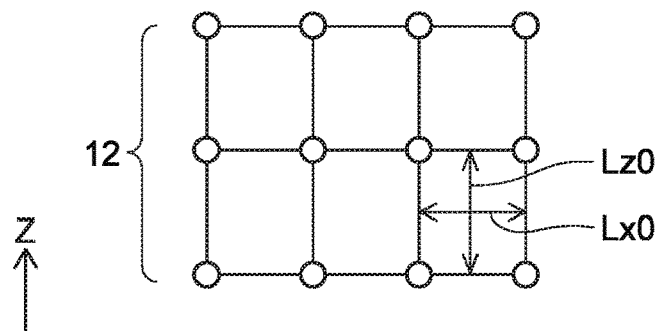
FIG. 3A and FIG. 3B are schematic views illustrating the material of the magnetic memory device according to the first embodiment.
Figure 3B:
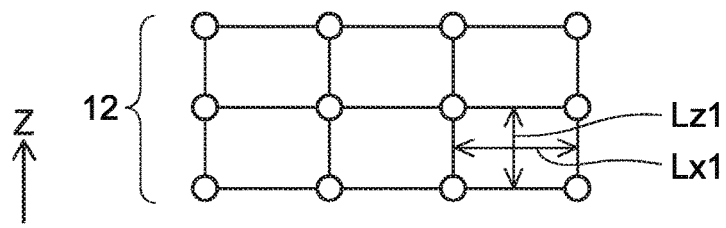

FIG. 3A and FIG. 3B are schematic views illustrating the material of the magnetic memory device according to the first embodiment.

FIG. 3A illustrates the lattice of the second magnetic layer 12 in a state without distortion. FIG. 3B illustrates the lattice of the second magnetic layer 12 in a state in which distortion is generated. The lattice constant of the material including the first metal EL1 and the boron EL2 (the material of the conductive layer 20) is larger than the lattice constant of the material included in the second magnetic layer 12 (e.g., CoFe, CoFeB, etc.). Distortion is generated in the second magnetic layer 12 by the effects of the material including the first metal EL1 and the boron EL2.

As shown in FIG. 2, the conductive layer 20 is crystalline. As shown in FIG. 3A, the second magnetic layer 12 is, for example, crystalline. The second magnetic layer 12 has a lattice length (a lattice constant Lx0) along one direction crossing the first direction (the Z-axis direction). The second magnetic layer 12 has a lattice length (a lattice constant Lz0) along the first direction. The lattice constant Lx0 and the lattice constant Lz0 are the lattice lengths in the state without distortion.

As shown in FIG. 3B, the second magnetic layer 12 is affected by the conductive layer 20; and the lattice length of the second magnetic layer 12 changes from the state illustrated in FIG. 3A. In this state, the second magnetic layer 12 has a lattice length Lx1 along the one direction recited above crossing the first direction (the Z-axis direction). The second magnetic layer 12 has a lattice length Lz1 along the first direction.

The lattice length Lx1 (the lattice spacing) of the second magnetic layer 12 along a direction crossing the first direction is longer than the lattice constant Lx0 of the second magnetic layer 12 along the direction crossing the first direction. The lattice length Lz1 (the lattice spacing) of the second magnetic layer 12 along the first direction is shorter than the lattice constant Lz0 of the second magnetic layer 12 along the first direction.

Such a distortion is generated in the second magnetic layer 12. The distortion is an anisotropic distortion. For example, the magnetic characteristics of the second magnetic layer 12 can be controlled. For example, a voltage effect is obtained.

The conductive layer 20 includes a crystal. For example, the <100> direction of the crystal is aligned with the X-axis direction. The <100> direction of the crystal crosses the first direction (the Z-axis direction). The absolute value of the angle between the <100> direction and the first direction is, for example, not less than 85 degrees and not more than 95 degrees. For example, the (100) plane of the crystal crosses the X-axis direction. For example, the (001) plane of the crystal is aligned with the X-Y plane. The (001) plane of the crystal crosses the first direction. The absolute value of the angle between the (001) plane and the first direction is, for example, not less than 85 degrees and not more than 95 degrees. For example, the conductive layer 20 includes a crystal of the (100) plane.

As described above, the conductive layer 20 includes hexaboride. The concentration of the boron EL2 in the conductive layer 20 is, for example, 80 atm % or more. The concentration of the boron EL2 in the conductive layer 20 may be, for example, 85 atm % or more.

As in the magnetic memory device 110a recited above (referring to FIG. 1B), the concentration of the boron EL2 in the second region 22 is not less than 80 atm % in the case where the first region 21 and the second region 22 are provided in the conductive layer 20. The concentration of the boron EL2 in the second region 22 may be 85 atm % or more.

The concentration of the boron EL2 is high in the material including the first metal EL1 and the boron EL2 (the material of the conductive layer 20). In other words, the concentration of a light element is high in the conductive layer 20. Therefore, a low damping constant is obtained. The thickness of the magnetic dead layer can be thin. For example, the write operation is stable. A magnetic memory device can be provided in which stable operations are possible.

The first metal EL1 (e.g., a rare earth or the like) oxidizes easily. The boron EL2 oxidizes easily. Therefore, as described below, good insulative properties are obtained for the side surface of the stacked body SB1, etc., when patterning the stacked body SB1 due to at least one of an oxide of the first metal EL1 or an oxide of the boron EL2 of the conductive layer 20.

In another embodiment, the first metal may include at least one selected from the group consisting of Ca, Sr, and Ba. Such an element is, for example, an alkaline earth metal. Even in such a case, the material that includes the first metal (the alkaline earth metal recited above) and the boron EL2 is a hexaboride. The material that includes the first metal (the alkaline earth metal recited above) and the boron EL2 has, for example, a CsCl crystal structure.

For example, the conductive layer 20 includes at least one selected from the group consisting of $CaB_6$, $SrB_6$, and $BaB_6$ in the case where the first metal (the alkaline earth metal recited above) includes at least one selected from the group consisting of Ca, Sr, and Ba. In one example as recited above, the first metal is, for example, an alkaline earth metal.

The lattice constant of the material including such an element (the first metal (the alkaline earth metal recited above)) and the boron EL2 is different from the lattice constant of the material included in the second magnetic layer 12 (e.g., CoFe, CoFeB, etc.). The lattice length of the second magnetic layer 12 changes from the lattice constant due to the lattice constant difference. Thereby, for example, anisotropy occurs in the second magnetic layer 12.

Such a distortion is generated in the second magnetic layer 12. The distortion is anisotropic distortion. For example, the magnetic characteristics of the second magnetic layer 12 can be controlled. For example, a voltage effect is obtained.

As described above, the conductive layer 20 includes a hexaboride. The concentration of the boron EL2 in the conductive layer 20 is, for example, 80 atm % or more. The concentration of the boron EL2 in the conductive layer 20 may be, for example, 85 atm % or more.

The concentration of the boron EL2 is high in the material (the material of the conductive layer 20) including the first metal (the alkaline earth metal recited above) and the boron EL2. In other words, the concentration of a light element is high in the conductive layer 20. Therefore, a low damping constant is obtained. The thickness of the magnetic dead layer can be thin. For example, the write operation is stable. A magnetic memory device can be provided in which stable operations are possible.

The first metal (the alkaline earth metal recited above) oxidizes easily. The boron EL2 oxidizes easily. Therefore, as described below, good insulative properties are obtained for the side surface of the stacked body SB1, etc., when patterning the stacked body SB1 due to at least one of the oxide of the first metal (the alkaline earth metal recited above) or the oxide of the boron EL2 of the conductive layer 20.

Several examples of the magnetic memory device according to the embodiment will now be described.

Figure 4:
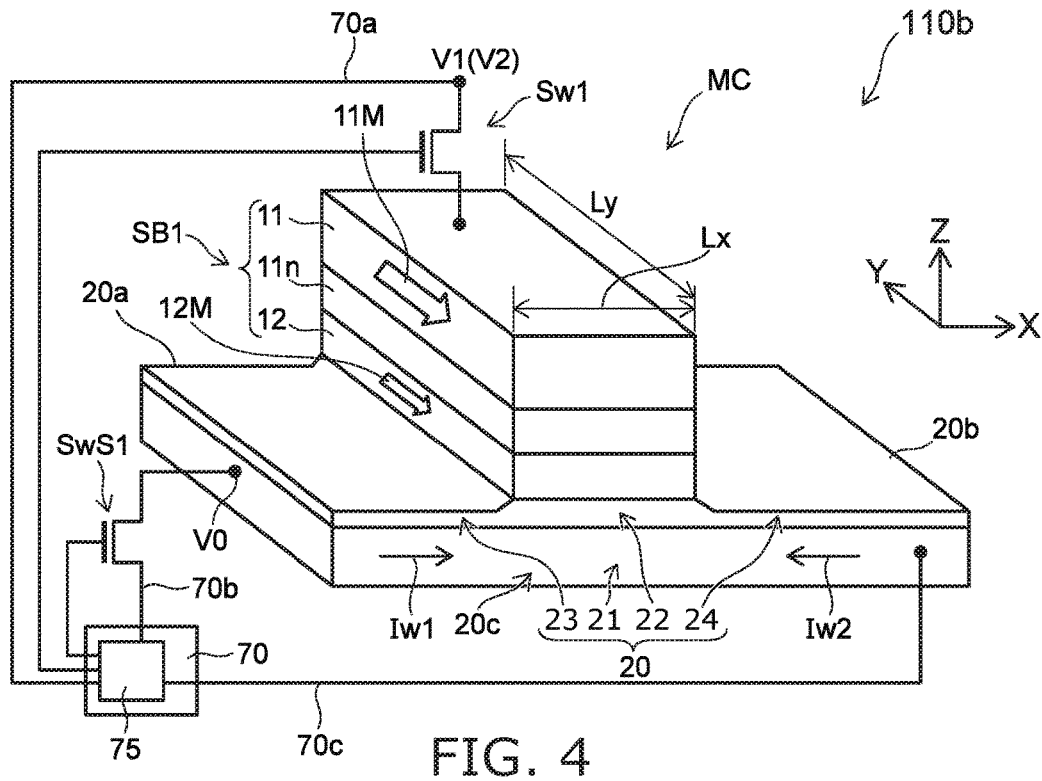
FIG. 4 is a schematic perspective view illustrating another magnetic memory device according to the first embodiment.

FIG. 4 is a schematic perspective view illustrating another magnetic memory device according to the first embodiment.

In the magnetic memory device 110b according to the embodiment as shown in FIG. 4, the thickness of a portion of the conductive layer 20 is thinner than the other portions. These configurations of the magnetic memory device 110b are similar to the configurations of the magnetic memory device 110a.

In the example, the conductive layer 20 further includes a third region 23 and a fourth region 24 in addition to the first region 21 and the second region 22. The second region 22 is between the third region 23 and the fourth region 24 in the second direction (the X-axis direction). In the example, the thickness along the first direction (the Z-axis direction) of the second region 22 is thicker than the thickness along the first direction of the third region 23. The thickness along the first direction (the Z-axis direction) of the second region 22 is thicker than the thickness along the first direction of the fourth region 24.

A large spin Hall effect is obtained in such a magnetic memory device 110b as well. Stable operations are possible.

For example, the magnetic memory device 110b is formed by forming, on a film used to form the conductive layer 20 including the first region 21 to the fourth region 24, a stacked film including a film used to form the second magnetic layer, and by subsequently patterning the stacked film. At this time, the magnetic memory device 110a or 110b is formed according to the conditions of the patterning. In other words, the magnetic memory device 110b is formed in the case where a portion of the film used to form the conductive layer 20 is removed in the patterning processing.

Figure 5:
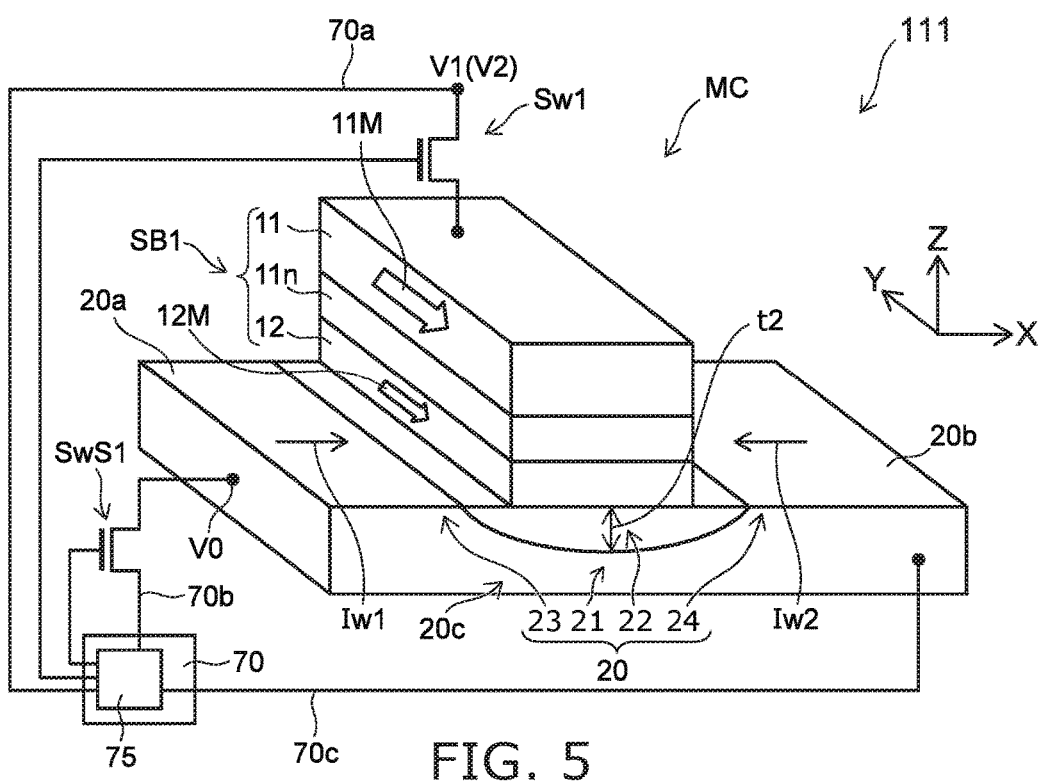
FIG. 5 is a schematic perspective view illustrating another magnetic memory device according to the first embodiment.

FIG. 5 is a schematic perspective view illustrating another magnetic memory device according to the first embodiment.

As shown in FIG. 5, the magnetic memory device 111 according to the embodiment also includes the conductive layer 20, the first magnetic layer 11, the second magnetic layer 12, the first nonmagnetic layer 11n, and the controller 70. In the magnetic memory device 111, the configuration of the conductive layer 20 is different from that of the magnetic memory device 110. Otherwise, the configuration of the magnetic memory device 111 is similar to the configuration of the magnetic memory device 110.

In the magnetic memory device 111, the conductive layer 20 further includes the third region 23 and the fourth region 24 in addition to the first region 21 and the second region 22. The second region 22 is between the third region 23 and the fourth region 24 in the second direction (the X-axis direction). For example, the third region 23 and the fourth region 24 do not include the boron EL2. Or, the concentration of the boron EL2 in the third region 23 and the concentration of the boron EL2 in the fourth region 24 each are lower than the concentration (the second concentration) of the boron EL2 in the second region 22.

In the magnetic memory device 111, the portion of the conductive layer 20 overlapping the second magnetic layer 12 locally includes the boron EL2. In the magnetic memory device 111, the portion (e.g., the third region 23 and the fourth region 24) of the conductive layer 20 not overlapping the second magnetic layer 12 has a composition similar to that of the first region 21. For example, the resistance of the conductive layer 20 can be low. For example, there is a tendency for the resistivity of the second region 22 to be higher than the resistivities of the first region 21, the third region 23, and the fourth region 24. For example, the resistance of the conductive layer 20 can be set to be low by locally providing a portion including the boron EL2.

Figure 6:
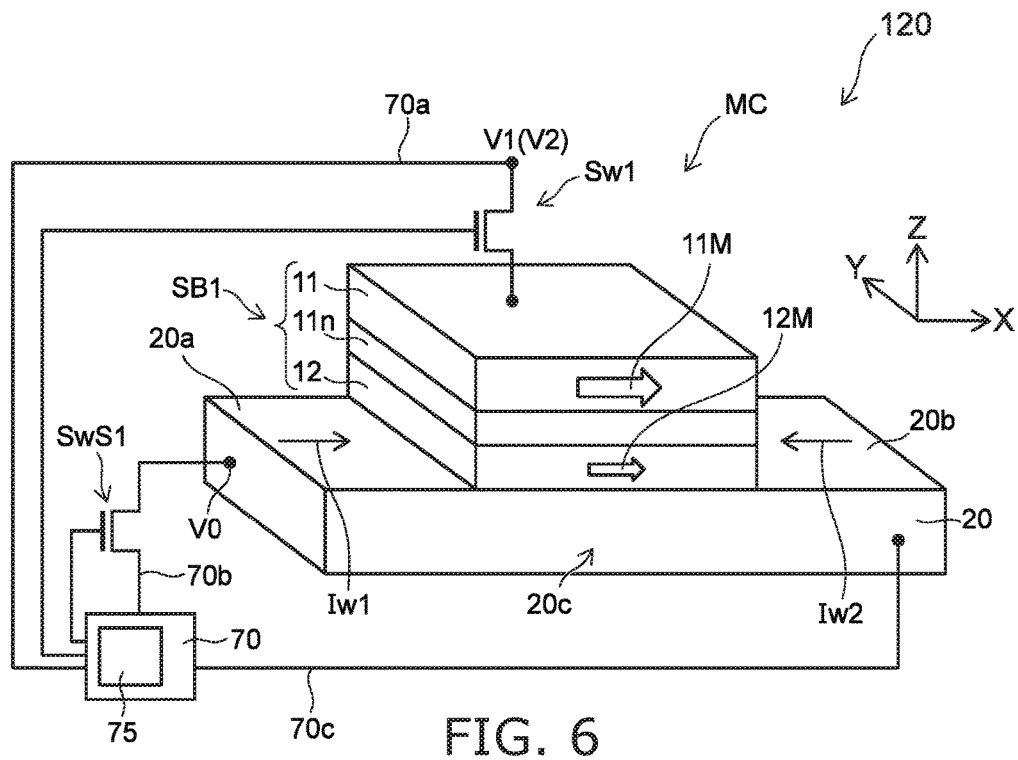
FIG. 6 is a schematic perspective view illustrating another magnetic memory device according to the first embodiment.

FIG. 6 is a schematic perspective view illustrating another magnetic memory device according to the first embodiment.

As shown in FIG. 6, the magnetic memory device 120 according to the embodiment also includes the conductive layer 20, the first magnetic layer 11, the second magnetic layer 12, the first nonmagnetic layer 11n, and the controller 70. In the magnetic memory device 120, the direction of the first magnetization 11M of the first magnetic layer 11 is different from that of the magnetic memory device 110. Otherwise, the configuration of the magnetic memory device 120 is similar to the configuration of the magnetic memory device 110.

In the magnetic memory device 120, the first magnetization 11M of the first magnetic layer 11 is aligned with the second direction (e.g., the X-axis direction). For example, the second magnetization 12M of the second magnetic layer 12 is substantially aligned with the second direction.

In the magnetic memory device 120, for example, a direct switching mode operation is performed. The speed of the magnetization reversal in the direct switching mode is higher than the speed of the magnetization reversal in a precessional switching mode. The magnetization reversal does not follow the precession in the direct switching mode. Therefore, the magnetization reversal rate is independent of the damping constant α. In the magnetic memory device 120, a high-speed magnetization reversal is obtained.

In the magnetic memory device 120, for example, the length in one direction (the length in the major-axis direction) of the first magnetic layer 11 is longer than the length in another one direction (the minor-axis direction length) of the first magnetic layer 11. For example, the length along the second direction (e.g., the X-axis direction) (the length in the major-axis direction) of the first magnetic layer 11 is longer than the length along the third direction (e.g., the Y-axis direction) (the minor-axis direction length) of the first magnetic layer 11. For example, the first magnetization 11M of the first magnetic layer 11 is easily aligned with the second direction due to the shape anisotropy.

In the magnetic memory device 120, for example, the major-axis direction of the first magnetic layer 11 is aligned with the second direction. The major-axis direction of the first magnetic layer 11 may be tilted with respect to the second direction. For example, the angle (the absolute value of the angle) between the major-axis direction of the first magnetic layer 11 and the second direction (a direction corresponding to the direction of the current flowing through the conductive layer 20) is, for example, not less than 0 degrees but less than 30 degrees. By such a configuration, for example, a high writing speed is obtained.

Figure 7:
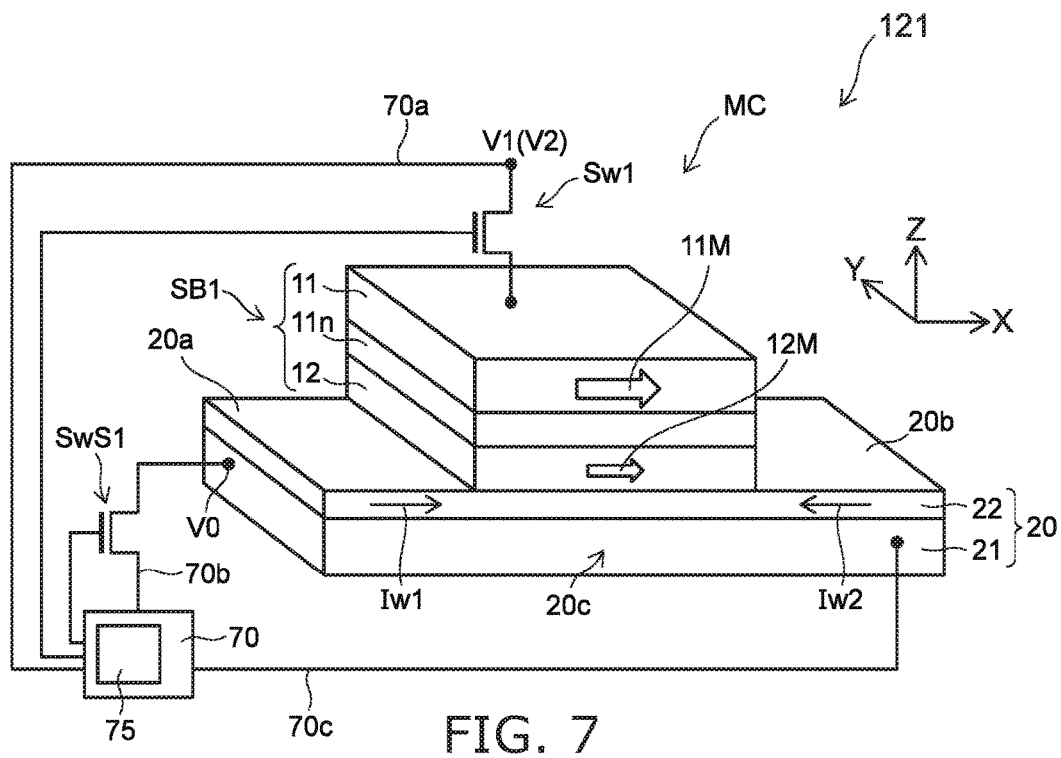
FIG. 7 is a schematic perspective view illustrating another magnetic memory device according to the first embodiment.

FIG. 7 is a schematic perspective view illustrating another magnetic memory device according to the first embodiment.

As shown in FIG. 7, the magnetic memory device 121 according to the embodiment also includes the conductive layer 20, the first magnetic layer 11, the second magnetic layer 12, the first nonmagnetic layer 11n, and the controller 70. In the magnetic memory device 121, the conductive layer 20 includes the first region 21 and the second region 22 described above. Otherwise, the configuration of the magnetic memory device 121 is similar to the configuration of the magnetic memory device 120.

Examples of the materials included in the various layers of the embodiment will now be described.

In the first embodiment, the second magnetic layer 12 includes, for example, at least one first element selected from the group consisting of Co, Fe, and Ni. The second magnetic layer 12 may further include boron (B). The second magnetic layer 12 may further include at least one second element selected from the group consisting of C, N, O, Si, and P. In the second magnetic layer 12, the concentrations of boron (the B) and the second element are, for example, 30 atm % or less. Thereby, for example, at least one of the lattice constant, the crystallinity, the magnetic properties, the mechanical properties, or the chemical properties can be controlled. By using such a material, for example, a high spin polarization ratio is obtained. For example, the second magnetic layer 12 includes at least one selected from the group consisting of Co, Fe, CoFe, CoFeB, FeB, CoB, CoFeSi, CoFeP, FeNi, FeNiB, FeNiSi, and FeNiP. The second magnetic layer 12 may include a stacked film including multiple films having different compositions. The second magnetic layer 12 includes, for example, CoFeB/CoFe or CoFeB/FeNiB. The second magnetic layer 12 may include, for example, a stacked film including multiple CoFeB films having mutually-different compositions. The second magnetic layer 12 may include, for example, a stacked film including multiple CoFe films having mutually-different compositions.

The second magnetic layer 12 may include, for example, a magnetic layer including a Co-based Heusler alloy. The Co-based Heusler alloy is notated as $Co_2YZ$. The second magnetic layer 12 includes at least one selected from the group consisting of $Co_2FeAl$, $Co_2MnSi$, $Co_2MnGe$, $Co_2Mn(Si, Ge)$, and $Co_2Mn(Ga, Ge)$.

The second magnetic layer 12 may have, for example, a stacked structure. The stacked structure is, for example, a SAF structure. In the SAF structure, for example, the effects of the stray magnetic field on the adjacent bits can be reduced.

The stacked structure includes, for example, CoFe(B)/(Ta, W, Mo, Cu, Cr)/CoFe(B), a Co-based Heusler alloy/(Ta, W, Mo, Cu, Cr)/CoFe(B), etc. The notation "(Ta, W, Mo, Cu, Cr)" means the inclusion of at least one selected from the group consisting of Ta, W, Mo, Cu, and Cr. The SAF structure includes, for example, at least one selected from the group consisting of CoFe(B)/(Ru, Rh, Ir)/CoFe(B) and a Co-based Heusler alloy/(Ru, Rh, Ir)/CoFe(B). The notation "(Ru, Rh, Ir)" means the inclusion of at least one selected from the group consisting of Ru, Rh, and Ir. The notation "(B)" means that B is included, or B is substantially not included.

The second magnetic layer 12 may include a stacked body. The stacked body includes, for example, at least one selected from the group consisting of a Co/Pt artificial lattice, a Co/Pd artificial lattice, a Co/Ru artificial lattice, a Co/Ir artificial lattice, and a Co/Au artificial lattice. In these artificial lattices, the addition of elements and the ratio of the thicknesses of the magnetic films and the nonmagnetic film are adjusted. Thereby, for example, the perpendicular magnetic anisotropy and the saturation magnetization are adjusted.

The first magnetic layer 11 has at least one of a coercivity that is larger than the coercivity of the second magnetic layer 12, a magnetic anisotropy energy that is larger than the magnetic anisotropy energy of the second magnetic layer 12, or a damping constant that is larger than the damping constant of the second magnetic layer 12. Thereby, the change of the electrical resistance of the magnetic memory device is obtained stably. The first magnetic layer 11 may include a stacked film including a first layer and a second layer. The first layer includes, for example, Mn and at least one element selected from the group consisting of Ir, Pt, Fe, and Rh. The second layer includes at least one element selected from the group consisting of Co, Fe, and Ni. The first magnetic layer 11 includes, for example, at least one selected from the group consisting of IrMn/CoFe, PtMn/CoFe, FeMn/CoFe, and RhMn/CoFe. For example, a stable magnetization direction is obtained. The first magnetic layer 11 may include a first layer, a second layer, a third layer, and a fourth layer. The fourth layer is provided between the third layer and the second layer. For example, the third layer contacts the first nonmagnetic layer 11n and has, for example, a high spin polarization ratio. The first magnetic layer 11 includes, for example, at least one selected from the group consisting of IrMn/CoFe/Ru/CoFeB, PtMn/CoFe/Ru/CoFeB, FeMn/CoFe/Ru/CoFeB, and RhMn/CoFe/Ru/CoFeB. Thereby, for example, a stable magnetization direction is obtained. For example, the change of the electrical resistance of the magnetic memory device is obtained stably.

The first nonmagnetic layer 11n includes, for example, at least one selected from the group consisting of MgO, MgAlO, and AlO. The first nonmagnetic layer 11n may include a stacked film including multiple films including these materials. The first nonmagnetic layer 11n may further include other nonmagnetic metals.

Second Embodiment

Figure 8:
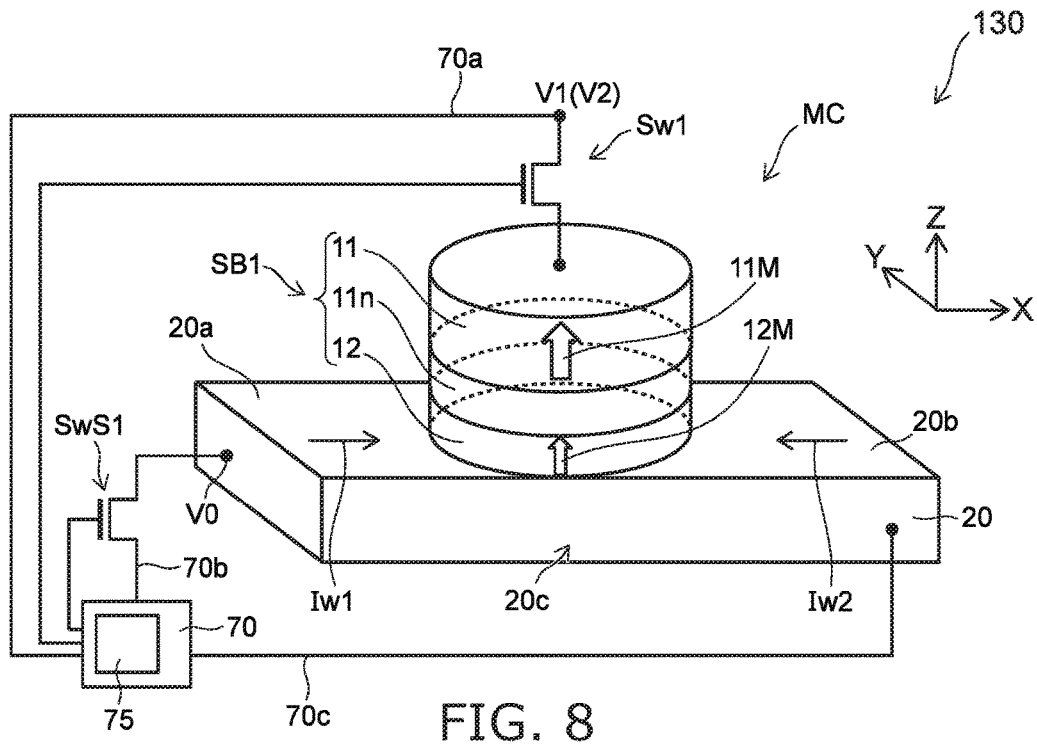
FIG. 8 is a schematic perspective view illustrating a magnetic memory device according to the second embodiment.

FIG. 8 is a schematic perspective view illustrating a magnetic memory device according to the second embodiment.

As shown in FIG. 8, the magnetic memory device 130 according to the second embodiment also includes the conductive layer 20, the first magnetic layer 11, the second magnetic layer 12, the first nonmagnetic layer 11n, and the controller 70. In the magnetic memory device 130, the direction of the first magnetization 11M of the first magnetic layer 11 is different from that of the magnetic memory device 110. Otherwise, the configuration of the magnetic memory device 130 is similar to the configuration of the magnetic memory device 110.

In the magnetic memory device 130, the first magnetization 11M of the first magnetic layer 11 is aligned with the first direction (e.g., the Z-axis direction). For example, the second magnetization 12M of the second magnetic layer 12 is substantially aligned with the first direction.

For example, the easy magnetization axis of the second magnetic layer 12 is aligned with the first direction (the Z-axis direction). For example, the absolute value of the angle between the Z-axis direction and the easy magnetization axis of the second magnetic layer 12 is 45 degrees or less.

A large spin Hall effect is obtained in the magnetic memory device 130 as well. Stable operations are possible.

For example, a direct switching mode operation is performed in the magnetic memory device 130. In the magnetic memory device 130, a high-speed magnetization reversal is obtained.

In the magnetic memory device 130, for example, the length along the second direction of the first magnetic layer 11 may be substantially the same as the length along the third direction of the first magnetic layer 11. In the magnetic memory device 130, a fine first stacked body SB1 (e.g., a MTJ element) is obtained easily. For example, a high storage density is obtained.

Figure 9:
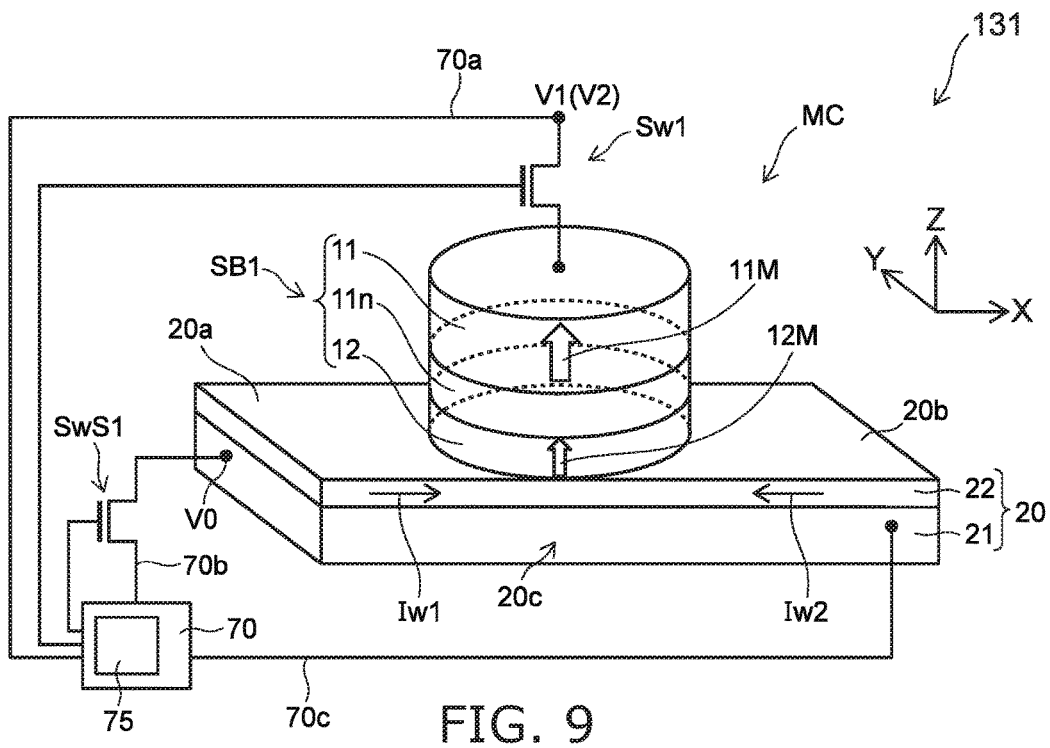
FIG. 9 is a schematic perspective view illustrating another magnetic memory device according to the second embodiment.

FIG. 9 is a schematic perspective view illustrating another magnetic memory device according to the second embodiment.

As shown in FIG. 9, the magnetic memory device 131 according to the embodiment also includes the conductive layer 20, the first magnetic layer 11, the second magnetic layer 12, the first nonmagnetic layer 11n, and the controller 70. In the magnetic memory device 131, the conductive layer 20 includes the first region 21 and the second region 22 described above. Otherwise, the configuration of the magnetic memory device 131 is similar to the configuration of the magnetic memory device 130.

In the magnetic memory device 131, the lattice of the conductive layer 20 (the first region 21) is stable because the first region 21 and the second region 22 recited above are provided. Thereby, the distortion of the lattice can be formed effectively in the second magnetic layer 12. By locally providing the second region 22 including B, a stable lattice can be maintained in the entire conductive layer 20. Also, the scattering efficiency of the electrons increases due to the local second region 22 including B. Thereby, a large spin Hall effect is obtained. In the magnetic memory device 131 as well, a large spin Hall effect is obtained. Stable operations are possible.

Examples of the materials of the second embodiment will now be described.

The second magnetic layer 12 may include a perpendicular magnetic film. An example of the case where the second magnetic layer 12 is a perpendicular magnetic film is as follows. The second magnetic layer 12 includes Mn and at least one element. The at least one element includes at least one selected from the group consisting of Al, Ge, and Ga. The second magnetic layer 12 includes, for example, at least one selected from the group consisting of MnGa, MnAl, MnGe, and MnAlGe. For example, the second magnetic layer 12 includes Mn, Ga, and at least one element. The at least one element includes at least one selected from the group consisting of Al, Ge, Ir, Cr, Co, Pt, Ru, Pd, Rh, Ni, Fe, Re, Au, Cu, B, C, P, Gd, Tb, and Dy. The second magnetic layer 12 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the case where the second magnetic layer 12 includes a perpendicular magnetic film, the second magnetic layer 12 may include, for example, an alloy. The alloy includes one element and another one element. The one element includes, for example, at least one selected from the group consisting of Fe, Co, and Ni. The other one element includes, for example, at least one selected from the group consisting of Ru, Rh, Pd, Ag, Ir, Pt, and Au. The alloy recited above may include, for example, at least one selected from the group consisting of FeRh, FePt, FePd, CoPt, and CoPd. These alloys are, for example, ferromagnetic alloys.

The first magnetic layer 11 may include, for example, an alloy in the case where the first magnetic layer 11 includes a perpendicular magnetic film. The crystal of at least a portion of the alloy has, for example, a (111) face-centered cubic structure (FCC) orientation. Or, the crystal of at least a portion of the alloy has a (0001) hexagonal close-packed structure (HCP) orientation. The alloy that is included in the first magnetic layer 11 may form, for example, an artificial lattice. For example, the alloy recited above that has the (111) FCC or (0001) HCP crystal orientation includes, for example, one element and another one element. The one element includes at least one selected from the group consisting of Fe, Co, Ni, and Cu. The other one element includes at least one selected from the group consisting of Pt, Pd, Rh, and Au. The alloy that is included in the first magnetic layer 11 is, for example, a ferromagnetic alloy. The ferromagnetic alloy includes, for example, at least one selected from the group consisting of CoPd, CoPt, NiCo, and NiPt.

The alloy recited above that is included in the first magnetic layer 11 and may form the artificial lattice includes, for example, a first layer and a second layer that are stacked alternately. The first layer includes, for example, an alloy (a ferromagnetic film) including one element selected from the group consisting of Fe, Co, and Ni. The second layer includes, for example, an alloy (a nonmagnetic film) including one element selected from the group consisting of Cr, Pt, Pd, Ir, Rh, Ru, Os, Re, Au, and Cu. The first magnetic layer 11 includes, for example, at least one selected from the group consisting of a Co/Pt artificial lattice, a Co/Pd artificial lattice, a CoCr/Pt artificial lattice, a Co/Ru artificial lattice, a Co/Ir artificial lattice, a Co/Os artificial lattice, a Co/Au artificial lattice, and a Ni/Cu artificial lattice. In these artificial lattices, at least one of the addition of an element to the ferromagnetic film or the ratio of the thicknesses of the ferromagnetic films and the nonmagnetic film is adjusted. At least one of the perpendicular magnetic anisotropy or the saturation magnetization can be adjusted.

The first magnetic layer 11 may include an alloy. The alloy includes one element and another one element. The one element includes at least one selected from the group consisting of Fe, Co, and Ni. The one element is, for example, a transition metal. The other one element includes, for example, at least one selected from the group consisting of Tb, Dy, and Gd. The other one element is, for example, a rare-earth metal. The first magnetic layer 11 includes, for example, at least one selected from the group consisting of TbFe, TbCo, TbFeCo, DyFeCo, GdFeCo, DyTbFeCo, and GdTbCo. The first magnetic layer 11 may include a stacked body. The stacked body includes multiple layers. Each of the multiple layers includes the alloy recited above. Multiple types of layers may be stacked alternately in the stacked body. The first magnetic layer 11 may include, for example, at least one stacked body selected from the group consisting of TbFe/Co, TbCo/Fe, TbFeCo/CoFe, DyFe/Co, DyCo/Fe, and DyFeCo/CoFe. For example, at least one of the thickness or the composition is adjusted for these alloys. For example, at least one of the perpendicular magnetic anisotropy or the saturation magnetization is adjusted.

The first magnetic layer 11 may include an alloy. The alloy includes one element and another one element. The one element includes at least one selected from the group consisting of Fe, Co, Ni, and Cu. The other one element includes at least one selected from the group consisting of Pt, Pd, Rh, and Au. The first magnetic layer 11 includes, for example, a ferromagnetic alloy. The ferromagnetic alloy includes at least one selected from the group consisting of FeRh, FePt, FePd, CoPt, and CoPd.

The material of the first nonmagnetic layer 11n of the second embodiment is similar to the material of the first nonmagnetic layer 11n of the first embodiment.

Third Embodiment

Figure 10:
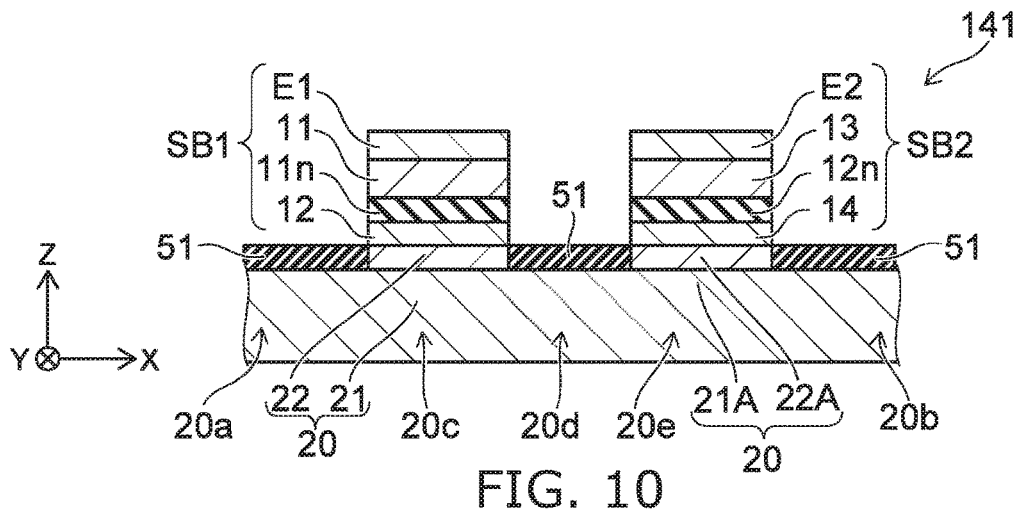
FIG. 10 is a schematic cross section illustrating a magnetic memory device according to a third embodiment.

FIG. 10 is a schematic cross section illustrating a magnetic memory device according to a third embodiment.

As shown in FIG. 10, the magnetic memory device 141 according to the embodiment includes a third magnetic layer 13, a fourth magnetic layer 14, and a second nonmagnetic layer 12n in addition to the conductive layer 20, the first magnetic layer 11, the second magnetic layer 12, and the first nonmagnetic layer 11n. The magnetic memory device 141 also includes the controller 70 (referring to FIG. 1A). The controller 70 is not illustrated in FIG. 10.

The first magnetic layer 11, the second magnetic layer 12, and the first nonmagnetic layer 11n are included in the first stacked body SB1. The third magnetic layer 13, the fourth magnetic layer 14, and the second nonmagnetic layer 12n are included in a second stacked body SB2. In the example, the first stacked body SB1 further includes a first electrode layer E1. The second stacked body SB2 further includes a second electrode layer E2.

The conductive layer 20 further includes a fourth portion 20d and a fifth portion 20e in addition to the first to third portions 20a to 20c. The third portion 20c is positioned between the first portion 20a and the second portion 20b in the second direction (the X-axis direction). The fourth portion 20d is provided between the third portion 20c and the second portion 20b in the second direction. The fifth portion 20e is provided between the fourth portion 20d and the second portion 20b in the second direction.

The first magnetic layer 11 is provided between the first electrode layer E1 and the third portion 20c in the first direction (the Z-axis direction). The second magnetic layer 12 is provided between the first magnetic layer 11 and the third portion 20c. The first nonmagnetic layer 11n is provided between the first magnetic layer 11 and the second magnetic layer 12.

The third magnetic layer 13 is provided between the second electrode layer E2 and the fifth portion 20e in the first direction (the Z-axis direction). The fourth magnetic layer 14 is provided between the third magnetic layer 13 and the fifth portion 20e. The second nonmagnetic layer 12n is provided between the third magnetic layer 13 and the fourth magnetic layer 14.

The first stacked body SB1 and the second stacked body SB2 each are memory cells MC.

As described above, the conductive layer 20 includes the first region 21 and the second region 22. The second region 22 is provided between the first region 21 and the second magnetic layer 12. For example, the second region 22 physically contacts the second magnetic layer 12. The second region 22 includes the first metal EL1 and the boron EL2. The conductive layer 20 further includes another first region 21A and another second region 22A. The other second region 22A is provided between the other first region 21A and the fourth magnetic layer 14. For example, the other second region 22A physically contacts the fourth magnetic layer 14. The other second region 22A includes the first metal EL1 and the boron EL2.

A first insulating region 51 is further provided in the magnetic memory device 141. For example, at least a portion of the first insulating region 51 is positioned between the second region 22 and the other second region 22A in the second direction (the X-axis direction). The first insulating region 51 includes, for example, an element included in the second region 22 and the other second region 22A. The first insulating region 51 includes, for example, at least one of an oxide including the element included in the second region 22 and the other second region 22A or a nitride including the element. For example, a material that has insulative properties is formed from a film including the materials used to form the second region 22 and the other second region 22A. The first insulating region 51 includes this material. Good insulative properties are obtained. Stable characteristics are obtained. The first insulating region 51 does not overlap the first magnetic layer 11 in the first direction (the Z-axis direction). The first insulating region 51 does not overlap the second magnetic layer 12 in the first direction (the Z-axis direction). The first insulating region 51 includes the first metal EL1 and at least one selected from the group consisting of oxygen and nitrogen. The first insulating region 51 may further include the boron EL2.

For example, at least a portion of the first insulating region 51 may be formed by a reaction (e.g., at least one of oxidization or nitridation) of at least a portion of the film used to form the second region 22 and the other second region 22A. At least a portion of the first insulating region 51 may include an unreacted portion of the film used to form the second region 22 and the other second region 22A.

Figure 11:
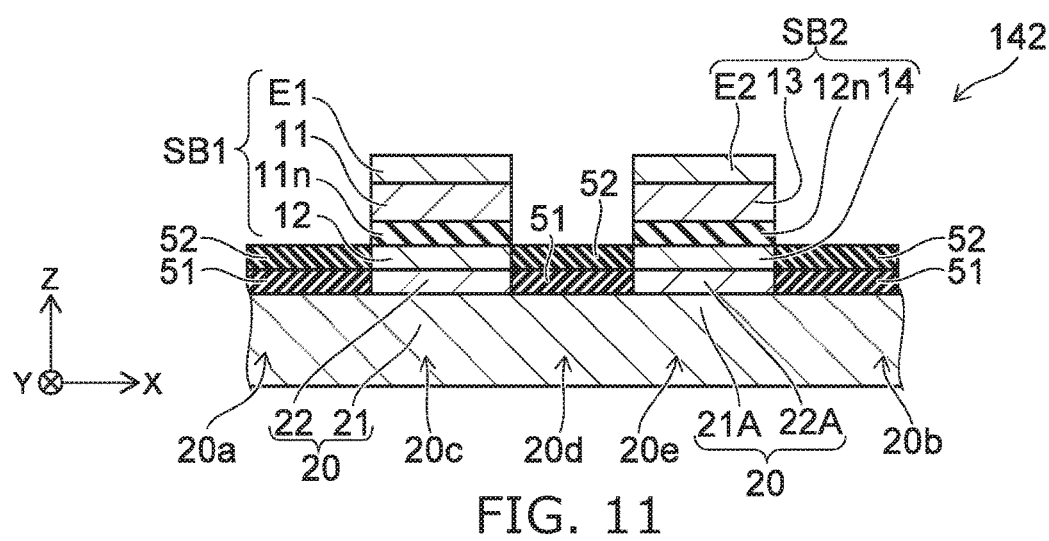
FIG. 11 is a schematic cross section illustrating another magnetic memory device according to the third embodiment.

FIG. 11 is a schematic cross section illustrating another magnetic memory device according to the third embodiment.

As shown in FIG. 11, a second insulating region 52 is further provided in the magnetic memory device 142 according to the embodiment. Otherwise, the configuration of the magnetic memory device 142 is the same as the configuration of the magnetic memory device 141.

For example, at least a portion of the second insulating region 52 is positioned between the second magnetic layer 12 and the fourth magnetic layer 14 in the second direction (the X-axis direction). The second insulating region 52 includes, for example, an element included in the second magnetic layer 12 and the fourth magnetic layer 14. The second insulating region 52 includes, for example, at least one of an oxide including the element included in the second magnetic layer 12 and the fourth magnetic layer 14 or a nitride including the element. For example, a material that has insulative properties is formed from a film including the materials used to form the second magnetic layer 12 and the fourth magnetic layer 14. The second insulating region 52 includes this material. Good insulative properties are obtained. Stable characteristics are obtained. The direction from the second magnetic layer 12 toward the second insulating region 52 is aligned with the second direction (the X-axis direction).

For example, at least a portion of the second insulating region 52 may be formed by a reaction (e.g., at least one of oxidization or nitridation) of at least a portion of the film used to form the second magnetic layer 12 and the fourth magnetic layer 14. At least a portion of the second insulating region 52 may include an unreacted portion of the film used to form the second magnetic layer 12 and the fourth magnetic layer 14.

Figure 12:
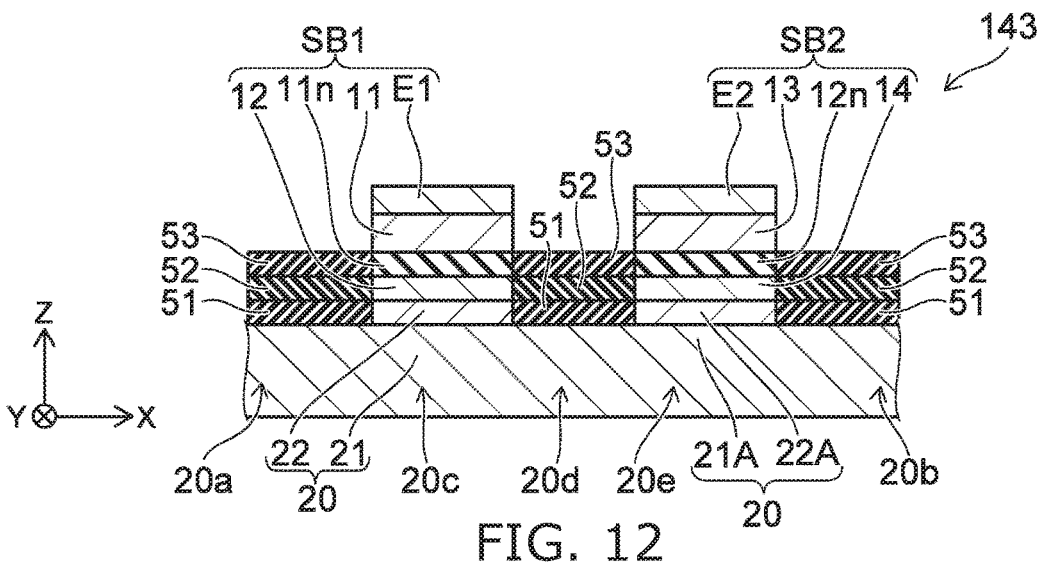
FIG. 12 is a schematic cross section illustrating another magnetic memory device according to the third embodiment.

FIG. 12 is a schematic cross section illustrating another magnetic memory device according to the third embodiment.

As shown in FIG. 12, a third insulating region 53 is further provided in the magnetic memory device 143 according to the embodiment. Otherwise, the configuration of the magnetic memory device 143 is the same as the configuration of the magnetic memory device 142.

For example, at least a portion of the third insulating region 53 is positioned between the first nonmagnetic layer 11n and the second nonmagnetic layer 12n in the second direction (the X-axis direction). The third insulating region 53 includes, for example, an element included in the first nonmagnetic layer 11n and the second nonmagnetic layer 12n. The third insulating region 53 includes, for example, at least one of an oxide including the element included in the first nonmagnetic layer 11n and the second nonmagnetic layer 12n or a nitride including the element. For example, a material that has insulative properties is formed from the film including the materials used to form the first nonmagnetic layer 11n and the second nonmagnetic layer 12n. The third insulating region 53 includes this material. Good insulative properties are obtained. Stable characteristics are obtained. The direction from the first nonmagnetic layer 11n toward the third insulating region 53 is aligned with the second direction (the X-axis direction).

For example, at least a portion of the third insulating region 53 may be formed by a reaction (e.g., at least one of oxidization or nitridation) of at least a portion of the film used to form the first nonmagnetic layer 11n and the second nonmagnetic layer 12n. At least a portion of the third insulating region 53 may include an unreacted portion of the film used to form the first nonmagnetic layer 11n and the second nonmagnetic layer 12n.

At least one of the first to third insulating regions 51 to 53 is applicable to any magnetic memory device according to the first and second embodiments.

Fourth Embodiment

Figure 13:
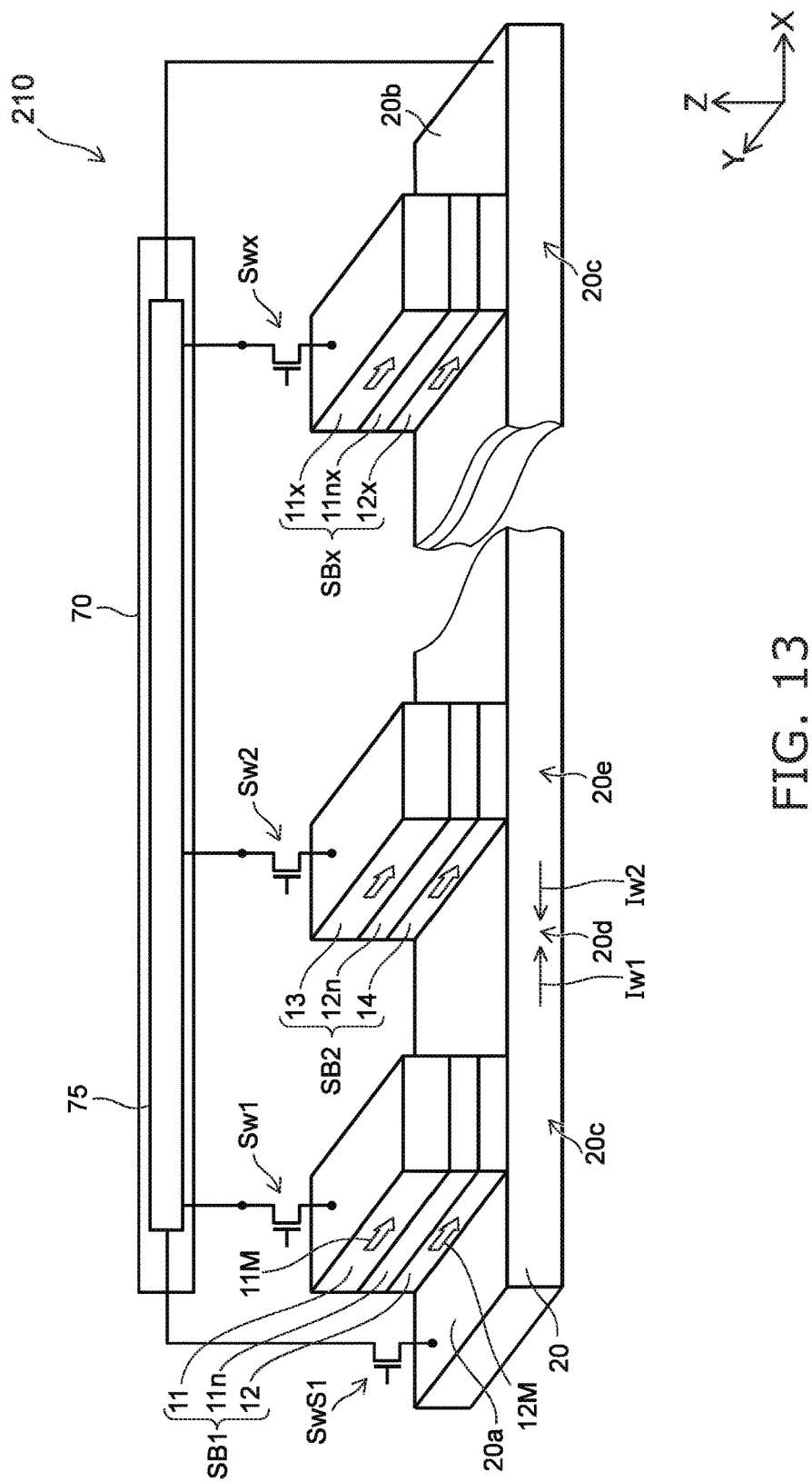
FIG. 13 is a schematic perspective view illustrating a magnetic memory device according to a fourth embodiment.

FIG. 13 is a schematic perspective view illustrating a magnetic memory device according to a fourth embodiment.

As shown in FIG. 13, multiple stacked bodies (the first stacked body SB1, the second stacked body SB2, a stacked body SBx, etc.) are provided in the magnetic memory device 210 according to the embodiment. Multiple switches (the switch Sw1, a switch Sw2, a switch Swx, etc.) also are provided. Otherwise, the configuration of the magnetic memory device 210 is similar to that of the magnetic memory device 110.

The conductive layer 20 further includes the fourth portion 20d and the fifth portion 20e in addition to the first to third portions 20a to 20c. As described above, the third portion 20c is positioned between the first portion 20a and the second portion 20b in the second direction (the X-axis direction). The fourth portion 20d is provided between the third portion 20c and the second portion 20b in the second direction. The fifth portion 20e is provided between the fourth portion 20d and the second portion 20b in the second direction.

The multiple stacked bodies are arranged along the conductive layer 20. The first stacked body SB1 overlaps the third portion 20c in the first direction (the Z-axis direction). The second stacked body SB2 overlaps the fifth portion 20e in the first direction. The direction from the first stacked body SB1 toward the second stacked body SB2 is aligned with the second direction.

For example, the second stacked body SB2 includes the third magnetic layer 13, the fourth magnetic layer 14, and the second nonmagnetic layer 12n. The third magnetic layer 13 is separated from a portion (the fifth portion 20e) of the conductive layer 20 in the first direction (the Z-axis direction). The fourth magnetic layer 14 is provided between the third magnetic layer 13 and the portion (the fifth portion 20e) of the conductive layer 20. The second nonmagnetic layer 12n is provided between the third magnetic layer 13 and the fourth magnetic layer 14.

For example, the third magnetic layer 13 is separated from the first magnetic layer 11 in the second direction (e.g., the X-axis direction). The fourth magnetic layer 14 is separated from the second magnetic layer 12 in the second direction. The second nonmagnetic layer 12n is separated from the first nonmagnetic layer 11n in the second direction.

For example, the stacked body SBx includes a magnetic layer 11x, a magnetic layer 12x, and a nonmagnetic layer 11nx. The magnetic layer 11x is separated from another portion of the conductive layer 20 in the first direction (the Z-axis direction). The magnetic layer 12x is provided between the magnetic layer 11x and the other portion of the conductive layer 20. The nonmagnetic layer 11nx is provided between the magnetic layer 11x and the magnetic layer 12x.

For example, the material and the configuration of the third magnetic layer 13 are the same as the material and the configuration of the first magnetic layer 11. For example, the material and the configuration of the fourth magnetic layer 14 are the same as the material and the configuration of the second magnetic layer 12. For example, the material and the configuration of the second nonmagnetic layer 12n are the same as the material and the configuration of the first nonmagnetic layer 11n.

The multiple stacked bodies function as multiple memory cells MC.

The switch Sw1 is electrically connected to the first magnetic layer 11. The switch Sw2 is electrically connected to the third magnetic layer 13. The switch Swx is electrically connected to the magnetic layer 11x. These switches are electrically connected to the control circuit 75 of the controller 70. Any of the multiple stacked bodies are selected by these switches.

Figure 14:
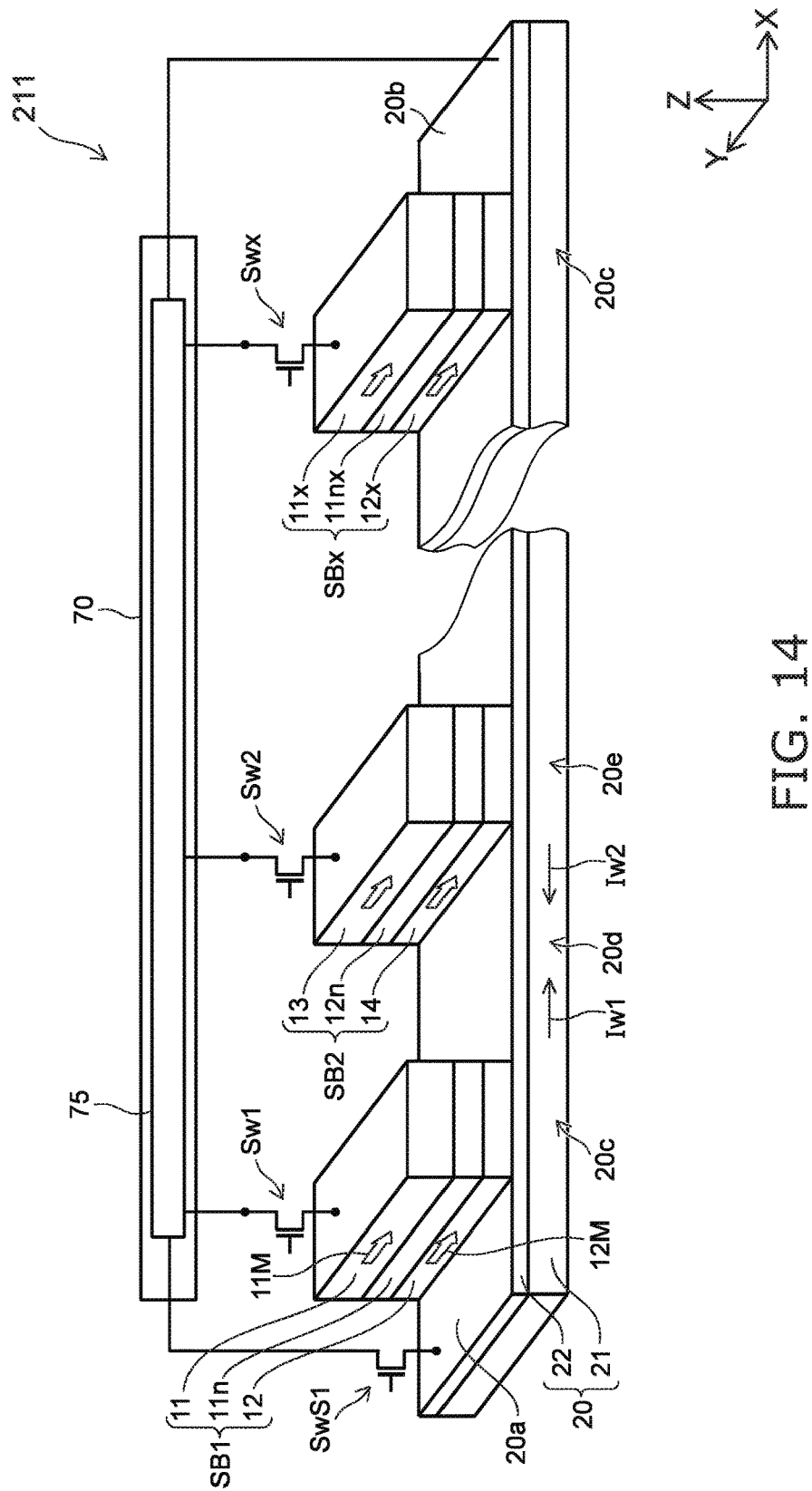
FIG. 14 is a schematic perspective view illustrating another magnetic memory device according to the fourth embodiment.

FIG. 14 is a schematic perspective view illustrating another magnetic memory device according to the fourth embodiment.

As shown in FIG. 14, multiple stacked bodies and multiple switches are provided in the magnetic memory device 211 according to the embodiment as well. Otherwise, the configuration of the magnetic memory device 211 is similar to the magnetic memory device 210.

The first region 21 and the second region 22 are provided in the magnetic memory device 211. The second region 22 is provided also between the fourth magnetic layer 14 and the first region 21. The second region 22 of the conductive layer 20 is provided also between the magnetic layer 12x and the first region 21. In the example of the magnetic memory device 211, the second region 22 extends along the second direction (e.g., the X-axis direction). The second region 22 is provided also in a region corresponding to the region between the multiple stacked bodies.

Fifth Embodiment

Figure 15A:
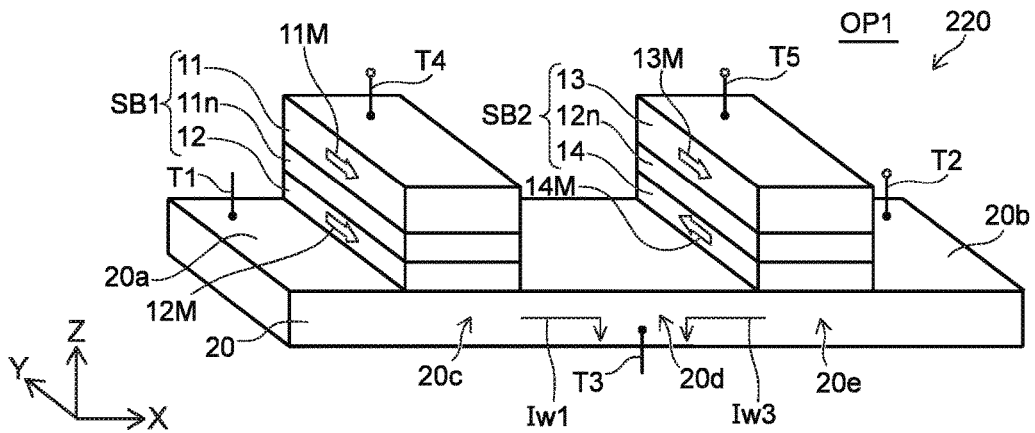
FIG. 15A to FIG. 15C are schematic perspective views illustrating a magnetic memory device according to a fifth embodiment.
Figure 15B:
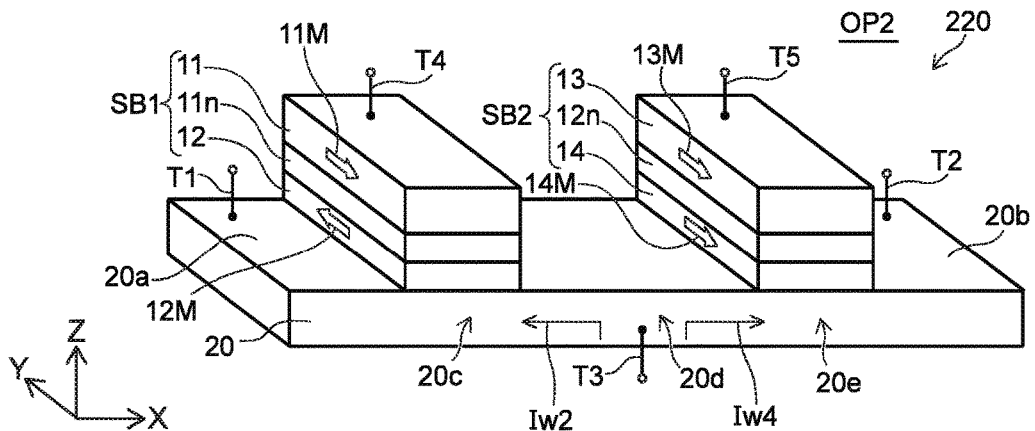
Figure 15C:
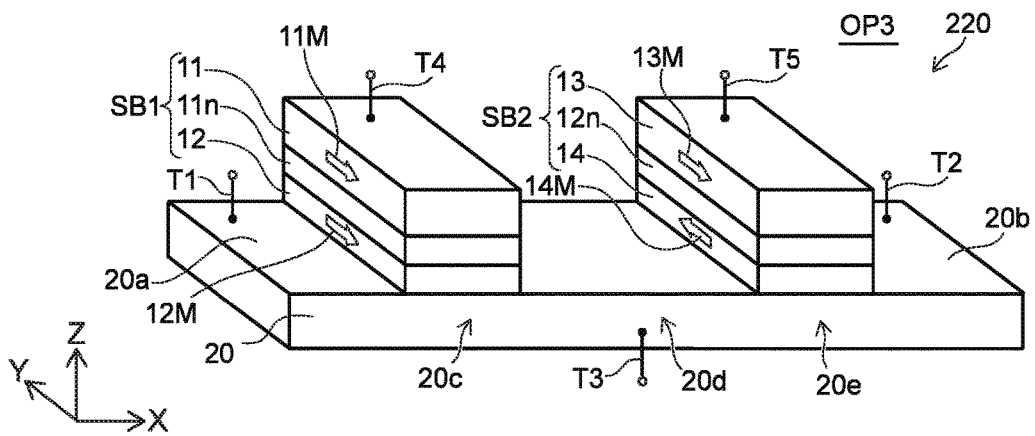

FIG. 15A to FIG. 15C are schematic perspective views illustrating a magnetic memory device according to a fifth embodiment.

As shown in FIG. 15A, multiple stacked bodies (the first stacked body SB1 and the second stacked body SB2) are provided in the magnetic memory device 220 according to the embodiment as well. In the magnetic memory device 220, the current that flows in the first stacked body SB1 and the current that flows in the second stacked body SB2 are different from each other.

The first stacked body SB1 overlaps the third portion 20c in the first direction (the Z-axis direction). The second stacked body SB2 overlaps the fifth portion 20e in the first direction. The fourth portion 20d of the conductive layer 20 corresponds to a portion between the first stacked body SB1 and the second stacked body SB2.

For example, a first terminal T1 is electrically connected to the first portion 20a of the conductive layer 20. A second terminal T2 is electrically connected to the second portion 20b. A third terminal T3 is electrically connected to the fourth portion 20d. A fourth terminal T4 is electrically connected to the first magnetic layer 11. A fifth terminal T5 is electrically connected to the third magnetic layer 13.

In one operation OP1 as shown in FIG. 15A, the first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation OP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation OP2 shown in FIG. 15B, the second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation OP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 15A and FIG. 15B, the orientation of a fourth magnetization 14M of the fourth magnetic layer 14 is the reverse of the orientation of the second magnetization 12M of the second magnetic layer 12. On the other hand, the orientation of a third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation OP1 corresponds to "1." For example, the information (the data) in the case of the operation OP2 corresponds to "0." By such operations, for example, the reading can be faster as described below.

In the operation OP1 and the operation OP2, the second magnetization 12M of the second magnetic layer 12 and the spin current of the electrons (the polarized electrons) flowing through the conductive layer 20 have an interaction. The orientation of the second magnetization 12M and the orientation of the spin of the polarized electrons have a parallel or an antiparallel relationship. The second magnetization 12M of the second magnetic layer 12 precesses and reverses. In the operation OP1 and the operation OP2, the orientation of the fourth magnetization 14M of the fourth magnetic layer 14 and the orientation of the spin of the polarized electrons have a parallel or an antiparallel relationship. The fourth magnetization 14M of the fourth magnetic layer 14 precesses and reverses.

FIG. 15C illustrates a read operation of the magnetic memory device 220.

In the read operation OP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as $\Delta V$. Two electrical resistances of each of the multiple stacked bodies are taken as a high resistance Rh and a low resistance Rl. The high resistance Rh is higher than the low resistance Rl. For example, the resistance corresponds to the high resistance Rh when the first magnetization 11M and the second magnetization 12M are antiparallel. For example, the resistance corresponds to the low resistance Rl when the first magnetization 11M and the second magnetization 12M are parallel. For example, the resistance corresponds to the high resistance Rh when the third magnetization 13M and the fourth magnetization 14M are antiparallel. For example, the resistance corresponds to the low resistance Rl when the third magnetization 13M and the fourth magnetization 14M are parallel.

For example, in the operation OP1 (the "1" state) illustrated in FIG. 15A, a potential Vr1 of the third terminal T3 is represented by Formula (1).

$$Vr1 = (Rl/(Rl+Rh)) \times \Delta V \tag{1}$$

On the other hand, a potential Vr2 of the third terminal T3 in the state of the operation OP2 (the "0" state) illustrated in FIG. 15B is represented by Formula (2).

$$Vr2 = ((Rh/(Rl+Rh)) \times \Delta V \tag{2}$$

Accordingly, a potential change $\Delta Vr$ between the "1" state and the "0" state is represented by Formula (3).

$$\Delta Vr = Vr2 - Vr1 = ((Rh-Rl)/(Rl+Rh)) \times \Delta V \tag{3}$$

The potential change $\Delta Vr$ is obtained by measuring the potential of the third terminal T3.

For example, the consumed energy when reading in the read operation OP3 recited above can be reduced compared to the case where a constant current is supplied to the stacked body (the magnetoresistive element) and the voltage (the potential difference) is measured between the two magnetic layers of the magnetoresistive element. In the read operation OP3 recited above, for example, high-speed reading can be performed.

In the operation OP1 and the operation OP2 recited above, the perpendicular magnetic anisotropies of the second magnetic layer 12 and the fourth magnetic layer 14 can be controlled by using the fourth terminal T4 and the fifth terminal T5. Thereby, the write current can be reduced. For example, the write current can be about ½ of the write current of the case where the writing is performed without using the fourth terminal T4 and the fifth terminal T5. For example, the write charge can be reduced. The relationship between the increase or decrease of the perpendicular magnetic anisotropy and the polarity of the voltage applied to the fourth terminal T4 and the fifth terminal T5 is dependent on the materials of the magnetic layers and the conductive layer 20.

Figure 16A:
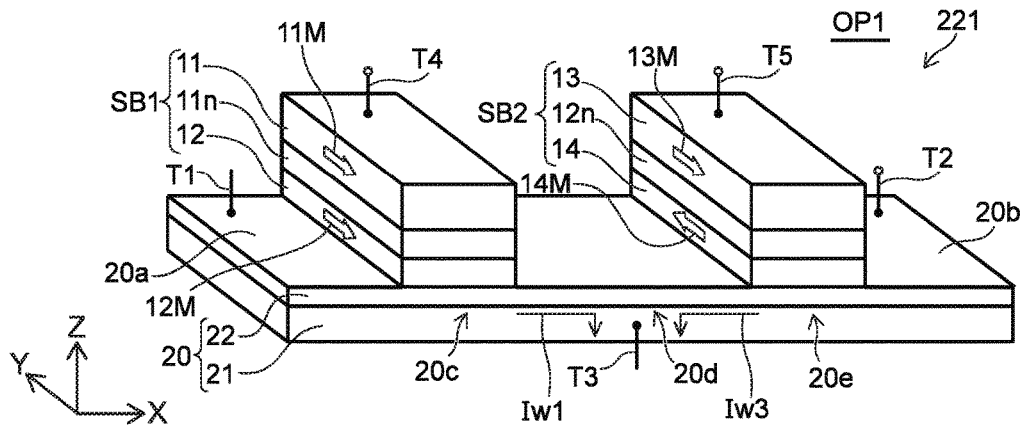
FIG. 16A to FIG. 16C are schematic perspective views illustrating another magnetic memory device according to the fifth embodiment.
Figure 16B:
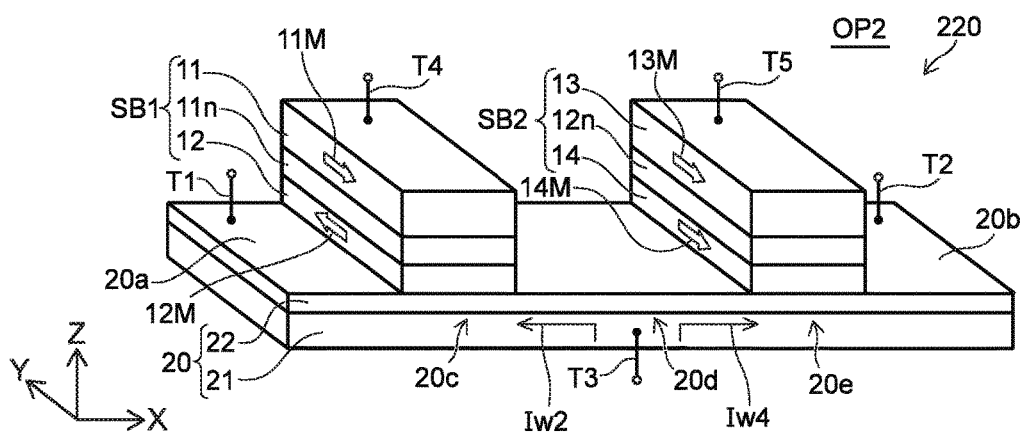
Figure 16C:
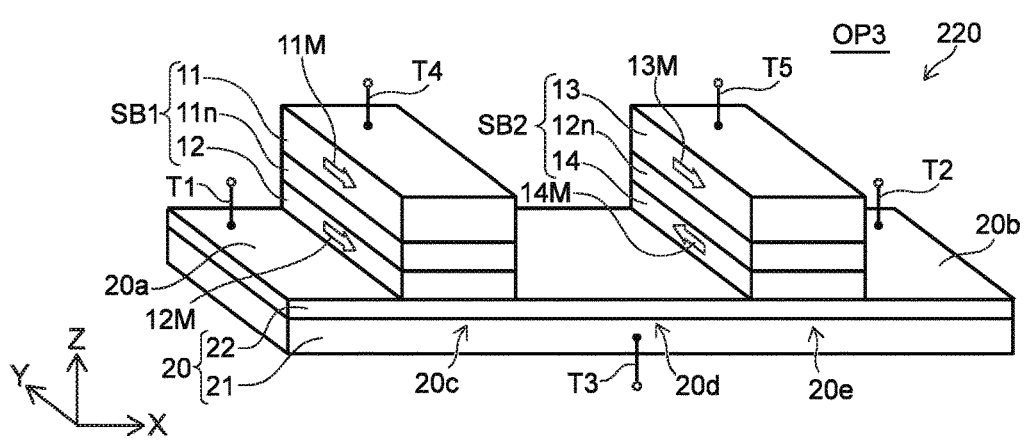

FIG. 16A to FIG. 16C are schematic perspective views illustrating another magnetic memory device according to the fifth embodiment.

As shown in FIG. 16A to FIG. 16C, the first region 21 and the second region 22 are provided in the magnetic memory device 221 according to the embodiment. Otherwise, the configuration of the magnetic memory device 221 is similar to that of the magnetic memory device 220.

In FIG. 15C recited above, the first terminal T1 and the second terminal T2 may be set to the same potential; the fourth terminal T4 and the fifth terminal T5 may be connected to the input terminals of a sense amplifier; and the potential difference between the fourth terminal T4 and the fifth terminal T5 may be read by the sense amplifier. A voltage may be applied to one of the first terminal T1 or the second terminal T2; and the other of the first terminal T1 or the second terminal T2 may be floating. Or, the current difference between the fourth terminal T4 and the fifth terminal T5 may be read by causing the same current to flow in the first terminal T1 and the second terminal T2. The first terminal T1 and the second terminal T2 may be set to the same potential; the fourth terminal T4 and the fifth terminal T5 may be connected to the input terminals of a sense amplifier; and the potential difference between the fourth terminal T4 and the fifth terminal T5 may be read by the sense amplifier. The fourth terminal T4 and the fifth terminal T5 may be set to the same potential; the first terminal T1 and the second terminal T2 may be connected to the input terminals of a sense amplifier; and the potential difference between the first terminal T1 and the second terminal T2 may be read by the sense amplifier.

Sixth Embodiment

Figure 17:
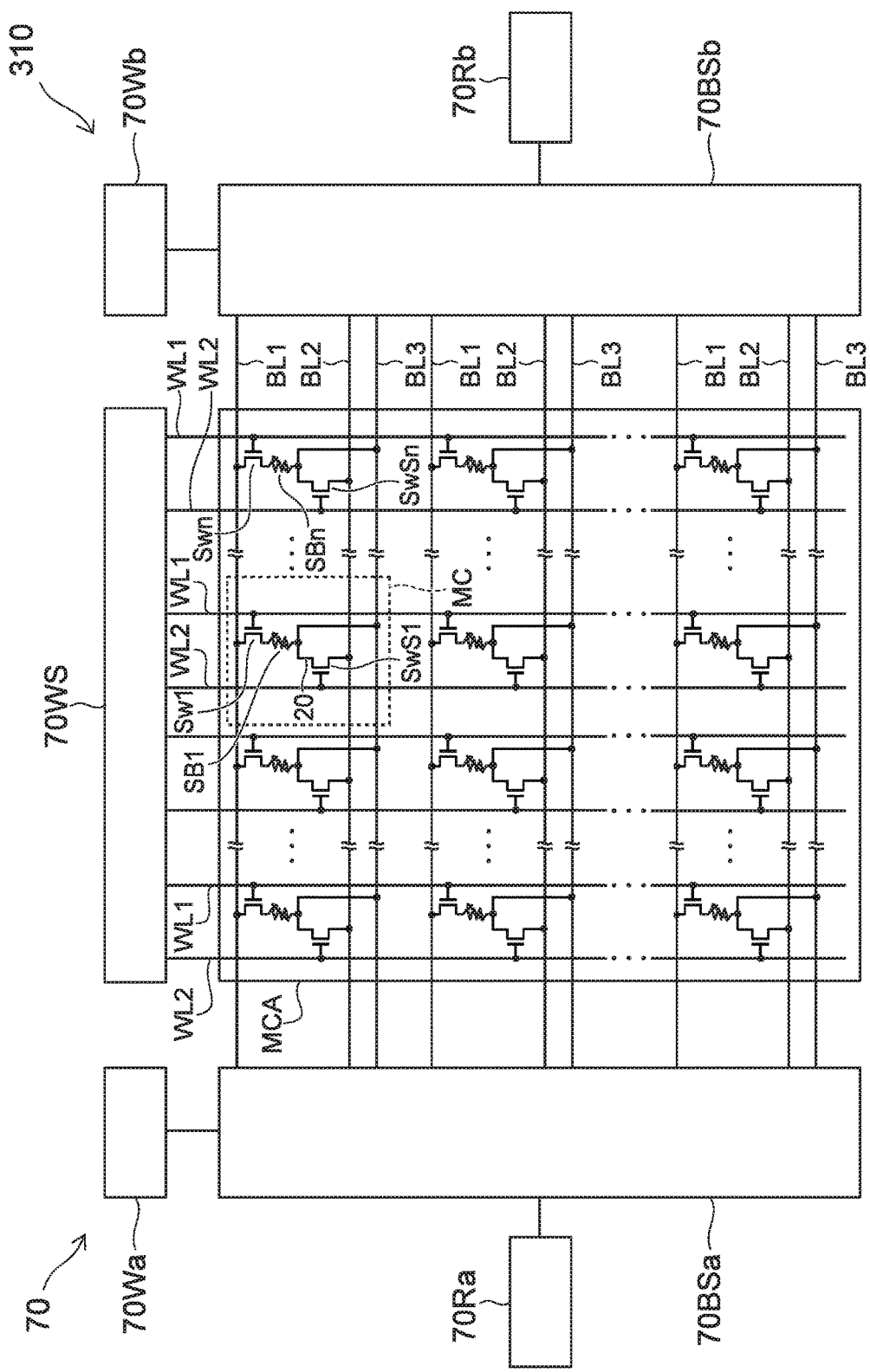
FIG. 17 is a schematic view showing a magnetic memory device according to a sixth embodiment.

FIG. 17 is a schematic view showing a magnetic memory device according to a sixth embodiment.

As shown in FIG. 17, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first write circuit 70Wa, a second write circuit 70Wb, a first read circuit 70Ra, and a second read circuit 70Rb. The multiple memory cells MC are arranged in an array configuration in the memory cell array MCA.

For example, the switch Sw1 and the switch SwS1 are provided to correspond to one of the multiple memory cells MC. These switches are considered to be included in the one of the multiple memory cells. These switches may be considered to be included in the controller 70. These switches are, for example, transistors. The one of the multiple memory cells MC includes, for example, a stacked body (e.g., the first stacked body SB1).

As described in reference to FIG. 10 to FIG. 16C, multiple stacked bodies (the first stacked body SB1, the second stacked body SB2, the stacked body SBx, etc.) may be provided for one conductive layer 20. Multiple switches (the switch Sw1, the switch Sw2, the switch Swx, etc.) may be provided respectively for the multiple stacked bodies. In FIG. 17, one stacked body (the stacked body SB1 or the like) and one switch (the switch Sw1 or the like) are drawn to correspond to one conductive layer 20 for easier viewing of the drawing.

As shown in FIG. 17, one end of the first stacked body SB1 is connected to the conductive layer 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive layer 20 is connected to one of the source or the drain of the switch SwS1. The other end (e.g., the second portion 20b) of the conductive layer 20 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the write operation of the information to the memory cell MC will now be described.

The switch SwS1 of one memory cell MC (the selected memory cell) to which the writing is to be performed is set to the ON state. For example, in the ON state, the word line WL2 that is connected to the gate of one switch SwS1 is set to a high-level potential. The setting of the potential is performed by the word line selection circuit 70WS. The switch SwS1 of another memory cell MC (an unselected memory cell) of the column including the one memory cell MC (the selected memory cell) recited above also is set to the ON state. In one example, the word line WL1 that is connected to the gate of the switch Sw1 inside the memory cell MC (the selected memory cell) and the word lines WL1 and WL2 that correspond to the other columns are set to a low-level potential.

Although one stacked body and one switch Sw1 that correspond to one conductive layer 20 are drawn in FIG. 17, the multiple switches (the switch Sw1, the switch Sw2, the switch Swx, etc.) and the multiple stacked bodies (the stacked body SB1, the second stacked body SB2, the stacked body SBx, etc.) that correspond to one conductive layer 20 are provided as described above. In such a case, for example, the switches that are connected respectively to the multiple stacked bodies are set to the ON state. The select voltage is applied to one of the multiple stacked bodies. On the other hand, the unselect voltage is applied to the other stacked bodies. Writing is performed to the one of the multiple stacked bodies recited above; and the writing is not performed to the other stacked bodies. Selective writing of the multiple stacked bodies is performed.

The bit lines BL2 and BL3 that are connected to the memory cell MC (the selected cell) to which the writing is to be performed are selected. The selection is performed by the first bit line selection circuit 70BSa and the second bit line selection circuit 70BSb. A write current is supplied to the selected bit lines BL2 and BL3. The supply of the write current is performed by the first write circuit 70Wa and the second write circuit 70Wb. The write current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12, etc.) of the MTJ element (the first stacked body SB1, etc.) is changeable by the write current. The magnetization direction of the memory layer of the MTJ element is changeable to the reverse direction of that recited above when the write current flows from the other of the first bit line selection circuit 70BSa or the second bit line selection circuit 70BSb toward the one of the first bit line selection circuit 70BSa or the second bit line selection circuit 70BSb. Thus, the writing is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON state. At this time, the switches Sw1 of the other memory cells MC (the unselected cells) of the column including the memory cell MC (the selected cell) recited above also are set to the ON state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the bit line BL1 and the bit line BL3 that are selected. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is sensed by the first read circuit 70Ra and the second read circuit 70Rb. For example, the difference between the magnetization of a reference layer (the first magnetic layer 11) and the magnetization of a memory layer (the second magnetic layer 12) of the MTJ element is sensed. The difference includes the orientation of the magnetization being in a mutually-parallel state (having the same orientation) or a mutually-antiparallel state (having the reverse orientation). Thus, the read operation is performed.

According to the embodiment, a magnetic memory device can be provided in which the write current can be reduced.

In this specification, the notation of "first material/second material" means that the first material is positioned on the second material. For example, a layer of the first material is formed on a layer of the second material.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to examples. However, the invention is not limited to these examples. For example, one skilled in the art may similarly practice the invention by appropriately selecting specific configurations of components included in the magnetic memory device such as the magnetic layer, the nonmagnetic layer, the conductive layer, the controller, etc., from known art; and such practice is within the scope of the invention to the extent that similar effects can be obtained.

Any two or more components of the examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a conductive layer including a first portion, a second portion, and a third portion between the first portion and the second portion, the conductive layer including a first metal and boron;
    a first magnetic layer separated from the third portion in a first direction crossing a second direction, the second direction being from the first portion toward the second portion;
    a second magnetic layer provided between the third portion and the first magnetic layer;
    a first nonmagnetic layer provided between the first magnetic layer and the second magnetic layer; and
    a controller electrically connected to the first portion and the second portion, the controller being configured to supply a current to the conductive layer,
    the first metal including at least one selected from the group consisting of La, Ce, Pr, Nd, Sm, Eu, Gd, Tb, Dy, Ho, Er, Tm, Yb, and Lu.

2. The device according to claim 1, wherein the first metal includes at least one selected from the group consisting of Ce, Pr, and Nd.

3. The device according to claim 1, wherein the first metal includes La.

4. The device according to claim 1, wherein the first metal includes at least one selected from the group consisting of Sm, Eu, Gd, Tb, Dy, Ho, Er, Tm, Yb, and Lu.

5. The device according to claim 1, wherein a concentration of boron in the conductive layer is 80 atm % or more.

6. The device according to claim 1, wherein at least a portion of the conductive layer has a CsCl crystal structure.

7. The device according to claim 1, wherein at least a portion of the conductive layer includes hexaboride.

8. The device according to claim 1, wherein
the conductive layer includes a crystal, and
a (001) plane of the crystal crosses the first direction.

9. The device according to claim 1, wherein
the controller implements:
    a first operation of supplying a first current to the conductive layer from the first portion toward the second portion; and
    a second operation of supplying a second current to the conductive layer from the second portion toward the first portion.

10. The device according to claim 9, wherein
the controller is further electrically connected to the first magnetic layer,
the controller further implements a third operation and a fourth operation,
in the first operation, the controller sets a potential difference between the first portion and the first magnetic layer to a first voltage,
in the second operation, the controller sets the potential difference between the first portion and the first magnetic layer to the first voltage,
in the third operation, the controller sets the potential difference between the first portion and the first magnetic layer to a second voltage and supplies the first current to the conductive layer,
in the fourth operation, the controller sets the potential difference between the first portion and the first magnetic layer to the second voltage and supplies the second current to the conductive layer,
the first voltage is different from the second voltage,
a first electrical resistance between the first magnetic layer and the first portion after the first operation is different from a second electrical resistance between the first magnetic layer and the first portion after the second operation, and
an absolute value of a difference between the first electrical resistance and the second electrical resistance is greater than an absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.

11. The device according to claim 1, wherein
the third portion includes a first region and a second region, the second region being provided between the first region and the second magnetic layer and including the first metal and boron, and
the first region does not include boron, or a first concentration of boron in the first region is lower than a second concentration of boron in the second region.

12. The device according to claim 11, wherein the concentration of boron in the second region is 80 atm % or more.

13. The device according to claim 11, wherein
the conductive layer further includes a third region and a fourth region,
the second region is between the third region and the fourth region in the second direction, and
the third region and the fourth region do not include boron, or a concentration of boron in the third region and a concentration of boron in the fourth region each are lower than the second concentration.

14. The device according to claim 13, wherein a thickness of the second region along the first direction is thicker than a thickness of the third region along the first direction and thicker than a thickness of the fourth region along the first direction.

15. The device according to claim 1, wherein
the second magnetic layer is crystalline, and
a lattice length of the second magnetic layer along the first direction is shorter than a lattice constant of the second magnetic layer along the first direction.

16. The device according to claim 1, wherein an easy magnetization axis of the second magnetic layer crosses the first direction.

17. The device according to claim 1, further comprising a first insulating region,
the first insulating region not overlapping the second magnetic layer in the first direction,
the first insulating region including the first metal and at least one selected from the group consisting of oxygen and nitrogen.

18. The device according to claim 1, further comprising a second insulating region,
a direction from the second magnetic layer toward the second insulating region being aligned with the second direction,
the second insulating region including an element and at least one selected from the group consisting of oxygen and nitrogen, and
the second magnetic layer includes the element.

19. The device according to claim 1, further comprising a third insulating region,
a direction from the first nonmagnetic layer toward the third insulating region being aligned with the second direction,
the third insulating region including an element and at least one selected from the group consisting of oxygen and nitrogen, and
the first nonmagnetic layer includes the element.

20. The device according to claim 1, wherein
the third portion includes a first region and a second region, the first region including the first metal, the second region being provided between the first region and the second magnetic layer and including the first metal and boron, and
the first region does not include boron, or a first concentration of boron in the first region is lower than a second concentration of boron in the second region.

* * * * *